United States Patent
Nakahara

(10) Patent No.: US 8,270,133 B2
(45) Date of Patent: Sep. 18, 2012

(54) POWER SUPPLY CONTROL APPARATUS

(75) Inventor: Akihiro Nakahara, Kanagawa (JP)

(73) Assignee: Renesas Electronics Corporation, Kawasaki, Kanagawa (JP)

( * ) Notice: Subject to any disclaimer, the term of this patent is extended or adjusted under 35 U.S.C. 154(b) by 100 days.

(21) Appl. No.: 12/905,414

(22) Filed: Oct. 15, 2010

(65) Prior Publication Data

US 2011/0101935 A1 May 5, 2011

(30) Foreign Application Priority Data

Nov. 5, 2009 (JP) ................... 2009-254362

(51) Int. Cl.
*H02H 3/00* (2006.01)
*H02H 3/20* (2006.01)

(52) U.S. Cl. .......... 361/84; 361/91.1; 307/127; 323/289

(58) Field of Classification Search ............... 323/276, 323/277, 289; 361/82, 84, 91.1; 307/127
See application file for complete search history.

(56) References Cited

U.S. PATENT DOCUMENTS

| | | | | |
|---|---|---|---|---|
| 4,890,185 A * | 12/1989 | Karl et al. | ................ | 361/91.6 |
| 5,166,852 A | 11/1992 | Sano | | |
| 6,034,448 A * | 3/2000 | Xu et al. | ................ | 307/127 |
| 6,882,513 B2 * | 4/2005 | Laraia | ................ | 361/91.1 |
| 7,129,759 B2 * | 10/2006 | Fukami | ................ | 327/110 |
| 7,283,343 B2 * | 10/2007 | Grose et al. | ................ | 361/84 |
| 7,508,255 B2 * | 3/2009 | Furuichi et al. | ................ | 327/543 |
| 8,031,450 B2 * | 10/2011 | Nakahara | ................ | 361/91.1 |
| 8,116,051 B2 * | 2/2012 | Nakahara | ................ | 361/84 |

| | | |
|---|---|---|
| 2009/0146628 A1 | 6/2009 | Nakahara |
| 2009/0147422 A1 | 6/2009 | Nakahara |
| 2009/0153225 A1 | 6/2009 | Nakahara |
| 2009/0154041 A1 | 6/2009 | Nakahara |

FOREIGN PATENT DOCUMENTS

| | | |
|---|---|---|
| DE | 3741394 A1 | 6/1989 |
| EP | 0 426 103 A2 | 5/1991 |
| EP | 2 071 723 A2 | 6/2009 |
| EP | 2 071 724 A1 | 6/2009 |
| EP | 2 071 725 A1 | 6/2009 |

(Continued)

OTHER PUBLICATIONS

European Search Report dated Feb. 24, 2011.

(Continued)

*Primary Examiner* — Gary L Laxton
(74) *Attorney, Agent, or Firm* — McGinn IP Law Group, PLLC

(57) ABSTRACT

A power supply control apparatus includes: an output transistor coupled between a first power supply line and an output terminal, the output terminal being configured to be coupled with a load; a protection transistor coupled between a gate of the output transistor and a second power supply line; a negative voltage control unit coupled between the first power supply line and the gate of the output transistor; a compensation transistor bringing the second power supply line and the output terminal into a conduction state when a counter electromotive voltage from the load is applied to the output terminal; and a back gate control circuit that controls the second power supply line and a back gate of each of the compensation transistor and the protection transistor to be brought into a conduction state in a standby state when the polarity of the power supply is normal.

16 Claims, 12 Drawing Sheets

FOREIGN PATENT DOCUMENTS

| | | |
|---|---|---|
| EP | 2 071 726 A2 | 6/2009 |
| JP | 2009-147994 A | 7/2009 |

OTHER PUBLICATIONS

European Search Report dated Feb. 21, 2011.
European Search Report dated Feb. 18, 2011.
European Search Report dated Feb. 24, 2011. (previously submitted on May 16, 2011).
European Search Report dated Mar. 20, 2012.
European Search Report dated Mar. 22, 2012.

\* cited by examiner

US 8,270,133 B2

POWER SUPPLY CONTROL APPARATUS

INCORPORATION BY REFERENCE

This application is based upon and claims the benefit of priority from Japanese patent application No. 2009-254362, filed on Nov. 5, 2009, the disclosure of which is incorporated herein in its entirety by reference.

BACKGROUND

1. Field of the Invention

The present invention relates to a power supply control apparatus, and more particularly to a power supply control apparatus including an output transistor that controls power supply to a load.

2. Description of Related Art

Semiconductors for power supply have been widely employed as power supply control apparatuses that supply power from a power supply to a load. In one field of application, the semiconductors are used to drive actuators or lamps of vehicles. Meanwhile, a counter electromotive voltage is occurred in an output terminal of a power supply control apparatus due to a load having an inductance component such as a solenoid, or an inductance component of a line that connects the load. The power supply control apparatus needs to include an overvoltage protection circuit in order to protect a power supply semiconductor against the counter electromotive voltage. Further, when the power supply is reversely connected (for example, when a battery is reversely connected by error in replacing a battery), it is required to suppress heat generation in the power supply semiconductor to prevent destruction of the power supply control apparatus by conducting the power supply semiconductor.

In the case of using such a power supply control apparatus for vehicles, there is a demand for preventing a wasteful consumption current from occurring when the power supply control apparatus is in a standby state, with a standby current on the order of microamperes.

Japanese Unexamined Patent Application Publication No. 2009-147994 discloses a solution for these demands. FIG. 12 is a circuit diagram corresponding to a power supply control apparatus 1 disclosed in Japanese Unexamined Patent Application Publication No. 2009-147994. As shown in FIG. 12, the power supply control apparatus 1 includes a power supply 10, a load 11, a driver circuit 12, a gate discharge circuit 13, a gate resistor R12, a back gate control circuit 15, a compensation circuit 16, a reverse connection protection circuit 17, a dynamic clamping circuit 19, a switch circuit 20, an output transistor T1, a resistor R10, a resistor R11, a diode D10, a power supply terminal PWR, a ground terminal GND, and an output terminal OUT. The gate resistor R12 may be omitted. The connection of the power supply control apparatus is described in detail in Japanese Unexamined Patent Application Publication No. 2009-147994, and thus the description thereof will be omitted.

Next, operations of the power supply control apparatus 1 will be described. In this case, the operations are classified into two types: an operation performed when the power supply 10 is normally connected; and an operation performed when the power supply 10 is reversely connected. Further, the operation performed when the power supply 10 is normally connected includes the following modes. That is, a conductive mode and a negative voltage surge mode. In the conductive mode, the output transistor T1 is rendered conductive, and power is supplied to the load 11 through the output terminal OUT. In the negative voltage surge mode, a negative voltage surge occurs to the output terminal OUT from the load 11 as a counter electromotive voltage on turn-off, when the output transistor T1 is changed from the conduction state to the non-conduction state. Hereinafter, the operations of the power supply control apparatus 1 are described in each of the three modes.

First, in the conductive mode, when a low-level control signal S2 output from the driver circuit 12 is applied to a gate of a discharge transistor MN1, the discharge transistor MN1 is rendered non-conductive. On the other hand, when a high-level control signal S1 output from the driver circuit 12 is applied to a gate of the output transistor T1, the output transistor T1 is rendered conductive. Thus, in the conductive mode, a voltage of the output terminal OUT is substantially the same to a positive-polarity-side voltage VB of the power supply 10. Further, in the conductive mode, N-type MOS transistors MN5 and MN6 of a second switch unit 15b are rendered conductive, and N-type MOS transistors MN3 and MN4 of a first switch unit 15a are rendered non-conductive. Accordingly, the voltage of the ground terminal GND is applied to a back gate of a compensation transistor MN7. At this time, in the compensation transistor MN7, a terminal coupled to the output terminal OUT serves as the drain, and a terminal coupled to a node C (a node between the reverse connection protection circuit 17 and the resistor R11) serves as the source. Since the voltage of the ground terminal GND is applied to a gate of the compensation transistor MN7, the compensation transistor MN7 is rendered non-conductive. Further, a protection transistor MN8 of the reverse connection protection circuit 17 is rendered non-conductive. Since the gate voltage is lower than the source voltage, a switch transistor MN11 provided in the switch circuit 20 is rendered non-conductive. Hence, the dynamic clamping circuit 19 is deactivated.

Next, the operation under the negative voltage surge mode is described. The negative voltage surge occurs on turn-off, when the output transistor T1 is switched from a conduction state to a non-conduction state. The negative voltage surge is generated due to influences of an inductance of the load 11 and an inductance of a line that connects the load 11. In this case, since the control signal S2 transits from a low level to a high level, the discharge transistor MN1 is rendered conductive. On the other hand, since the control signal S1 transits from the high level to the low level, the output transistor T1 is rendered non-conductive.

When the output transistor T1 is switched from the conduction state to the non-conduction state (turn-off period), due to the influences of an inductance of the load 11 and an inductance of a line that connects the load 11, a counter electromotive voltage of the negative voltage is generated in the output terminal OUT. In the turn-off period, when the voltage of the output terminal OUT is higher than the voltage of the ground terminal GND, the N-type MOS transistors MN3 and MN4 of the first switch unit 15a are rendered non-conductive, and the N-type MOS transistors MN5 and MN6 of the second switch unit 15b are rendered conductive. Thus, a voltage supplied to the back gate of the compensation transistor MN7 by the back gate control circuit 15 is the voltage of the ground terminal GND. When the voltage of the output terminal OUT is below the voltage of the ground terminal GND (negative voltage surge), the N-type MOS transistors MN3 and MN4 of the first switch unit 15a are rendered conductive, and the N-type MOS transistors MN5 and MN6 of the second switch unit 15b are rendered non-conductive. Accordingly, the voltage supplied to the back gate of the compensation transistor MN7 by the back gate control circuit 15 is the voltage of the output terminal OUT. At this time, in the compensation transistor MN7, the output terminal OUT side serves as the source, and the node C side serves as the drain. Since the gate voltage is higher than the source voltage in the compensation transistor MN7, the compensation transistor MN7 is rendered conductive. As a result, the voltage of the node C is equal to that of the output terminal OUT.

When the negative voltage surge is occurred in the output terminal OUT, the gate voltage of the output transistor T1 becomes the negative voltage as well since the discharge transistor MN1 is rendered conductive. At this time, while the protection transistor MN8 of the reverse connection protection circuit 17 is rendered non-conductive, a parasitic diode D8 formed to the protection transistor MN8 is biased in the forward direction. However, the voltage of the node C is substantially the same as the voltage of the output terminal OUT since the compensation transistor MN7 is rendered conductive, and the protection transistor MN8 is deactivated. Since the protection transistor MN8 is deactivated, a path through which the current flows from the ground terminal GND to the output terminal OUT through the parasitic diode D8 of the protection transistor MN8 and the discharge transistor MN1 is interrupted.

On the other hand, since the switch transistor MN11 of the switch circuit 20 has a gate voltage substantially equal to the voltage of the ground terminal GND (0 V, for example), and a source (gate of the output transistor T1) voltage of negative voltage, the switch transistor MN11 is rendered conductive. Thus, the dynamic clamping circuit 19 is activated. When the source-drain voltage of the output transistor T1 becomes equal to or larger than a clamp voltage due to the decrease of the voltage of the output terminal OUT, the diode D11 provided in the dynamic clamping circuit 19 is rendered conductive, and the output transistor T1 is rendered conductive. The clamp voltage here means the sum of the breakdown voltage of the diode D11, the threshold voltage of the switch transistor MN11, and the threshold voltage of the output transistor T1. As stated before, when the negative voltage is generated in the output terminal OUT, a drain-source voltage of the output transistor T1 is clamped to the clamp voltage, thereby protecting the output transistor T1 from overvoltage.

The negative voltage surge is generated until when the energy stored in the inductance is released. When the release of the energy is completed, the voltage of the output terminal OUT is 0 V. Then the output transistor T1 is rendered non-conductive.

Next, the operation under the reverse connection mode will be described. In the reverse connection mode, the positive-polarity-side voltage VB is coupled to the ground terminal GND and a negative-polarity-side voltage VSS is coupled to the power supply terminal PWR. In this case, the diode D10 is rendered conductive, and a voltage of the node B (node on an anode side of the diode D10) is equal to a forward voltage of the diode D10 (0.7 V, for example). Further, a current flows from the ground terminal GND to the power supply terminal PWR through the load 11 and the parasitic diode formed between a back gate and a drain of the output transistor T1. Accordingly, the voltage of the output terminal OUT is equal to a forward voltage of the parasitic diode (0.7 V, for example).

In summary, the voltage of the node B and that of the output terminal OUT become equal to each other (0.7 V, for example). Accordingly, the N-type MOS transistors MN5 and MN6 of the second switch unit 15b are in the non-conduction state, and the N-type MOS transistors MN3 and MN4 of the first switch unit 15a are in the non-conduction state as well.

Further, the voltage of 0.7 V is supplied to a back gate of each of the protection transistor MN8 and the compensation transistor MN7. In this case, in the compensation transistor MN7, the output terminal OUT side serves as the source, and the node C side serves as the drain. Now, the gate voltage is equal to the source voltage in the compensation transistor MN7, and thus the compensation transistor MN7 is rendered non-conductive. On the other hand, although the protection transistor MN8 is rendered non-conductive, the parasitic diode D8 formed in the protection transistor MN8 is biased in the forward direction. Thus, electric charges are supplied from the ground terminal GND to the gate of the output transistor T1 through the parasitic diode D8, and the output transistor T1 is rendered conductive.

From the above description, the power supply control apparatus 1 according to the related art is able to maintain the output transistor T1 to the conduction state, and to prevent heat generation in the reverse connection mode. Furthermore, the power supply control apparatus according to the related art is able to protect the output transistor T1 from overvoltage in the negative voltage surge mode without impairing an overvoltage protection function.

SUMMARY

The present inventors have found that a loss may occur under certain conditions in the prior art. Specifically, a loss occurs in which, in the case where the power supply control apparatus of the prior art shown in FIG. 12 is integrated on a semiconductor substrate, when the power supply control apparatus is operated at a high voltage within operating conditions, vertical parasitic bipolar transistors Q4 to Q7 formed to the transistors MN4, MN6, and MN7 become conductive, resulting in generation of a consumption current. The generation of the consumption current is described below.

In the case where the power supply control apparatus of the prior art is in a standby state, a P-well of each of the transistors MN4, MN6, and MN7 (a base of each of the parasitic bipolar transistors Q4 to Q7) is not electrically connected to a drain/source of each of the transistors MN4, MN6, and MN7 (an emitter of each of the parasitic bipolar transistors Q4 to Q7). As a result, the base of each parasitic bipolar transistor becomes open. Here, a breakdown voltage of each parasitic bipolar transistor can be represented by a breakdown voltage BVceo between an emitter and a collector when the base is open.

FIG. 11 is a graph showing breakdown voltage characteristics of a bipolar transistor. As is generally known, the breakdown voltage BVceo of the bipolar transistor when the base is open and a breakdown voltage BVcbo of the bipolar transistor when a potential is applied to the base have a correlation with a current amplification factor hFE as expressed by the following expression.

$$BVceo = BVcbo / \sqrt[4]{hFE} \quad (1)$$

In the development of a device, there is a tradeoff relation between the device size and the breakdown voltage. In this case, the breakdown voltage BVcbo is designed to have an optimum value. For instance, when a breakdown voltage of 40 V is required, the device is generally designed to have the breakdown voltage BVcbo of about 60 V.

The current amplification factor hFE of each of the parasitic bipolar transistors Q4 to Q7 shown in FIG. 12 is about 100, for example. That is, as shown in Expression (1), the breakdown voltage BVceo is about one-third of the breakdown voltage BVcbo.

Accordingly, in the case where the power supply control apparatus of the prior art is in the standby state, when a voltage higher than the breakdown voltage BVceo is applied to each of the parasitic bipolar transistors Q4 to Q7, the parasitic bipolar transistors Q4 to Q7 are broken down, with the result that a current flows through the parasitic bipolar transistors. This leads to an increase in the consumption current of the power supply control apparatus of the prior art.

Thus, in the power supply control apparatus of the prior art, the back gate of each transistor provided in the compensation circuit 16 and the back gate of each transistor provided in the back gate control circuit 15 become open (high impedance) when the power supply control apparatus is in the standby state. This causes a problem that a current flows through the parasitic bipolar transistors and the consumption current increases.

Furthermore, when the conventional power supply control apparatus shown in FIG. 12 is integrated on the semiconductor substrate, the parasitic bipolar transistors formed to MN7, MN8, MN11, and MN1 when the power supply is reversely connected interrupt the output transistor T1 from maintaining the conduction state. This is because, when the power supply is reversely connected, each parasitic bipolar transistor is conducted, and the gate charge of the output transistor T1 is drawn off.

A first exemplary aspect of an embodiment of the present invention is a power supply control apparatus including: an output transistor coupled between a first power supply line and an output terminal, the output terminal being configured to be coupled with a load; a protection transistor coupled between a gate of the output transistor and a second power supply line, and bringing the output transistor into a conduction state when a polarity of a power supply coupled between the first power supply line and the second power supply line is reversed; a negative voltage control unit coupled between the first power supply line and the gate of the output transistor, and bringing the output transistor into a conduction state when the counter electromotive voltage applied to the output terminal from the load exceeds a predetermined value; a compensation transistor bringing the second power supply line and the output terminal into a conduction state when a counter electromotive voltage from the load is applied to the output terminal; and a back gate control circuit that controls the second power supply line and a back gate of each of the compensation transistor and the protection transistor to be brought into a conduction state in a standby state when the polarity of the power supply is normal.

The circuit configuration as described above makes it possible to suppress an increase in consumption current in the standby state when the power supply is normally connected.

According to an exemplary aspect of the present invention, it is possible to provide a power supply control apparatus capable of suppressing an increase in consumption current in a standby state when the power supply is normally connected.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

Hereinafter, exemplary embodiments of the present invention will be described in detail with reference to the drawings. An overlapping description will be omitted as appropriate for the sake of clarification of the description.

First Exemplary Embodiment

Figure 1:
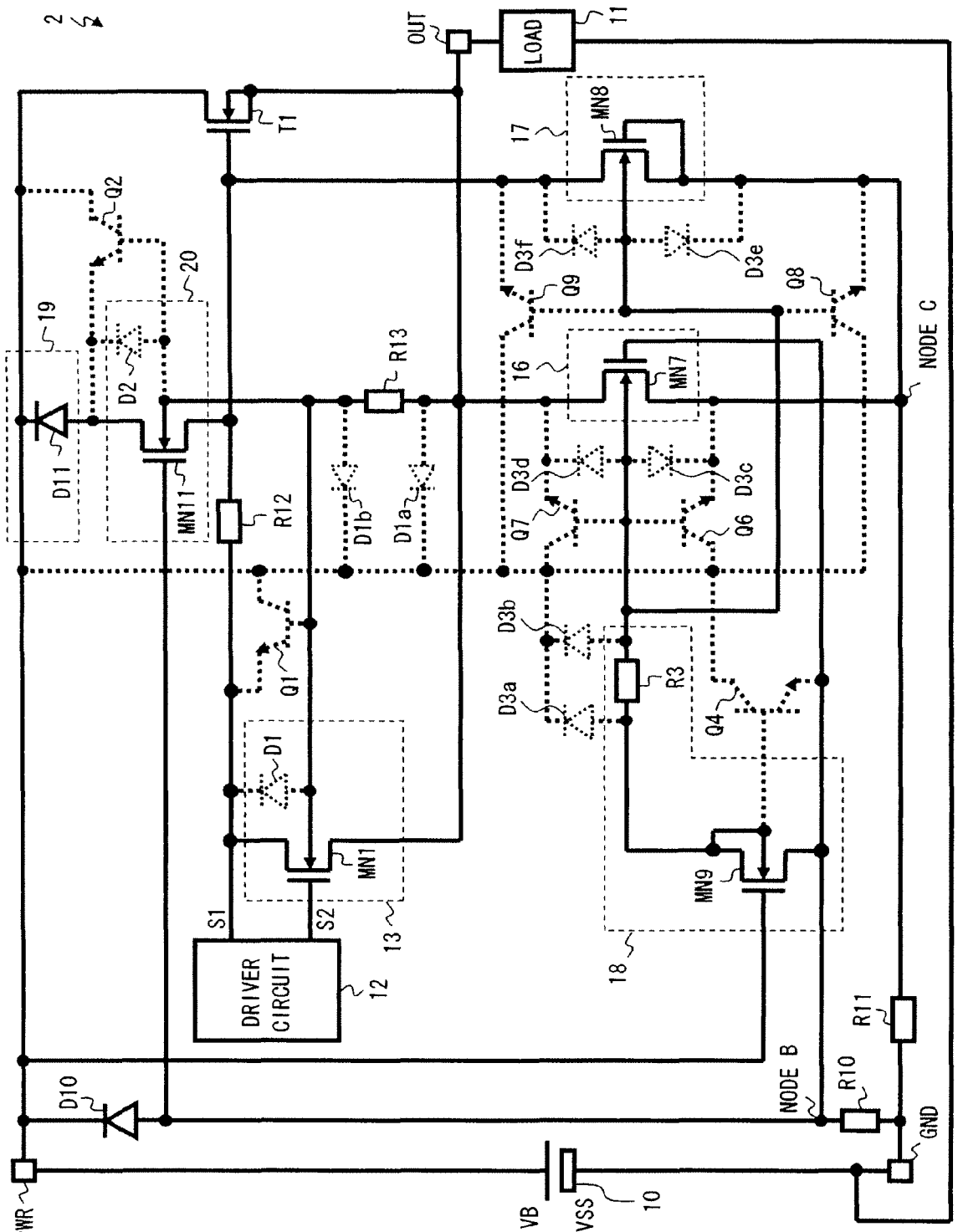
FIG. 1 is a circuit diagram of a power supply control apparatus according to a first exemplary embodiment of the present invention.

FIG. 1 shows a circuit diagram of a power supply control apparatus 2 according to a first exemplary embodiment of the present invention. As shown in FIG. 1, the power supply control apparatus 2 includes a power supply 10, a load 11, a driver circuit 12, a gate discharge circuit 13, a gate resistor R12, a back gate control circuit 18, a compensation circuit 16, a reverse connection protection circuit 17, a dynamic clamping circuit 19, a switch circuit 20, an output transistor T1, a resistor (first resistor) R3, a resistor (third resistor) R10, a resistor (second resistor) R11, a resistor (fourth resistor) R13, a diode D10, a power supply terminal PWR, a ground terminal GND, and an output terminal OUT. The gate resistor R12 may be omitted. Further, in the first exemplary embodiment, a power supply line that couples the power supply 10 and the output transistor T1 through the power supply terminal PWR is referred to as a first power supply line, and a power supply line that couples the power supply 10 through the ground terminal GND is referred to as a second power supply line.

Further, the dynamic clamping circuit 19 and the switch circuit 20 constitute a negative voltage control unit.

The power supply 10 is coupled between the power supply terminal PWR and the ground terminal GND. In a normal connection state, the power supply 10 supplies a positive-polarity-side voltage VB to the power supply terminal PWR, and supplies a negative-polarity-side voltage VSS to the ground terminal GND. The load 11 is coupled between the output terminal OUT and the ground terminal GND. The load 11 is an actuator or a lamp, for example, and supplied with power in the power supply control apparatus 2.

The driver circuit 12 is a control device of the power supply control apparatus 2. The driver circuit 12 supplies a control signal S1 to a gate of the output transistor T1, and supplies a control signal S2 to the gate discharge circuit 13. In the first exemplary embodiment, the control signals S1 and S2 are signals having opposite phases. The driver circuit 12 controls a conduction state of the output transistor T1 according to the control signals S1 and S2.

The output transistor T1 has a drain coupled to the power supply terminal PWR and a source coupled to the output terminal OUT. The control signal S1 is supplied to the gate of the output transistor T1. The output transistor T1 is rendered conductive when the control signal S1 goes high, and is rendered non-conductive when the control signal S1 goes low. The gate resistor R12 is coupled between the gate of the output transistor T1 and the driver circuit 12. In short, the gate resistor R12 has one terminal coupled to the gate of the output transistor T1 and the other terminal coupled to the driver circuit 12.

The gate discharge circuit 13 is coupled between the output terminal OUT and the other terminal of the gate resistor R12, and is controlled by the driver circuit 12. The gate discharge circuit 13 draws electric charges from the gate of the output transistor T1 when the control signal S2 goes high. Further, the gate discharge circuit 13 is rendered non-conductive when the control signal S2 goes low, and draws no electric charge from the gate of the output transistor T1.

More specifically, the gate discharge circuit 13 includes a discharge transistor MN1. In the first exemplary embodiment, an N-type MOS transistor is used as the discharge transistor MN1. The discharge transistor MN1 has a drain coupled to the gate of the output transistor T1 through the gate resistor R12, a gate to which the control signal S2 is supplied, a source coupled to the output terminal OUT, and a back gate coupled to the output terminal OUT through the resistor R13.

A parasitic bipolar transistor Q1 and a parasitic diode D1 are formed to the discharge transistor MN1 as parasitic elements. Specifically, the parasitic bipolar transistor Q1 has a base connected to the back gate of the discharge transistor MN1, an emitter coupled to the gate of the output transistor T1, and a collector coupled to the power supply terminal PWR. The parasitic diode D1 has an anode connected to the back gate of the discharge transistor MN1, and a cathode coupled to the gate of the output transistor T1.

The dynamic clamping circuit 19 and the switch circuit 20 are coupled in series between the power supply terminal PWR and the gate of the output transistor T1. The dynamic clamping circuit 19 is coupled between the power supply terminal PWR and the switch circuit 20. More specifically, the dynamic clamping circuit 19 includes a diode D11. The diode D11 has a cathode coupled to the power supply terminal PWR, and an anode coupled to the switch circuit 20.

The switch circuit 20 is coupled between the anode of the diode D11 and the gate of the output transistor T1. More specifically, the switch circuit 20 includes a first switch transistor MN11. In the first exemplary embodiment, an N-type MOS transistor is used as the first switch transistor MN11. The first switch transistor MN11 has a drain coupled to the anode of the diode D11, a source coupled to the gate of the output transistor T1, a gate coupled to a node B, and a back gate coupled to the output terminal OUT through the resistor R13. The node B denotes a node on the anode side of the diode D10 described below.

A parasitic bipolar transistor Q2 and a parasitic diode D2 are formed to the first switch transistor MN11 as parasitic elements. More specifically, the parasitic bipolar transistor Q2 has a base connected to the back gate of the first switch transistor MN11, an emitter connected to the drain side of the first switch transistor MN11, and a collector coupled to the power supply terminal PWR. The parasitic diode D2 has an anode connected to the back gate of the first switch transistor MN11, and a cathode connected to the drain side of the first switch transistor MN11.

The resistor R13 has one terminal coupled to the back gate of each of the first switch transistor MN11 and the discharge transistor MN1, and the other terminal coupled to the output terminal OUT. Parasitic diodes D1a and D1b are formed between the both terminals of the resistor R13 and the power supply terminal PWR as parasitic elements. More specifically, the parasitic diode D1a has an anode connected to the terminal on the output terminal OUT side of the resistor R13, and a cathode coupled to the power supply terminal PWR. The parasitic diode D1b has an anode connected to the terminal on the back gate side of the discharge transistor MN1 of the resistor R13, and a cathode coupled to the power supply terminal PWR.

The compensation circuit 16 is coupled to the output terminal OUT, and is also coupled to the ground terminal GND through the resistor R11. The resistor R11 and the compensation circuit 16 are coupled through a node C. In summary, the compensation circuit 16 is coupled between the output terminal OUT and the node C. The compensation circuit 16 short-circuits the node C and the output terminal OUT when the voltage of the output terminal OUT becomes lower than a predetermined voltage. The compensation circuit 16 includes a compensation transistor MN7. In the first exemplary embodiment, an N-type MOS transistor is used as the compensation transistor MN7. The compensation transistor MN7 has one of a source and a drain coupled to the output terminal OUT, the other of the source and the drain coupled to the node C, a gate coupled to the node B, and a back gate coupled to the back gate control circuit 18 through the resistor R3. The back gate control circuit 18 controls the back gate voltage of the compensation transistor MN7.

Parasitic bipolar transistors Q6 and Q7 and parasitic diodes D3c and D3d are formed to the compensation circuit 16 as parasitic elements. More specifically, the parasitic bipolar transistor Q6 has a base connected to the back gate of the compensation transistor MN7, an emitter connected to a source/drain diffusion region on the node C side in the compensation transistor MN7, and a collector coupled to the power supply terminal PWR. The parasitic bipolar transistor Q7 has a base connected to the back gate of the compensation transistor MN7, an emitter connected to a source/drain diffusion region on the output terminal OUT side in the compensation transistor MN7, and a collector coupled to the power supply terminal PWR. The parasitic diode D3c has an anode connected to the back gate of the compensation transistor MN7, and a cathode connected to the source/drain diffusion region on the node C side in the compensation transistor MN7. The parasitic diode D3d has an anode connected to the back gate of the compensation transistor MN7, and a cathode connected to the source/drain diffusion region on the output terminal OUT side in the compensation transistor MN7.

The reverse connection protection circuit 17 is coupled between the node C and the gate of the output transistor T1. The reverse connection protection circuit 17 is rendered conductive when the power supply 10 is reversely connected to supply electric charges to the gate of the output transistor T1, which brings the output transistor T1 into a conduction state. The reverse connection protection circuit 17 includes a protection transistor MN8. In the first exemplary embodiment, an N-type MOS transistor is used as the protection transistor MN8. The protection transistor MN8 has one of a source and a drain coupled to the gate of the output transistor T1, the other of the source and the drain coupled to the node C, a gate coupled to the node C, and a back gate coupled to the back gate control circuit 18 through the resistor R3. The back gate control circuit 18 controls a back gate voltage of the compensation transistor MN7.

Parasitic bipolar transistors Q8 and Q9, and parasitic diodes D3e and D3f are formed to the reverse connection protection circuit 17 as parasitic elements. More specifically, the parasitic bipolar transistor Q8 has a base connected to the back gate of the protection transistor MN8, an emitter connected to the source/drain diffusion region on the node C side in the protection transistor MN8, and a collector coupled to the power supply terminal PWR. The parasitic bipolar transistor Q9 has a base connected to the back gate of the protection transistor MN8, an emitter connected to a source/drain diffusion region on the gate side of the output transistor T1 in the protection transistor MN8, and a collector coupled to the power supply terminal PWR. The parasitic diode D3e has an anode connected to the back gate of the protection transistor MN8, and a cathode connected to the source/drain diffusion region on the node C side in the protection transistor MN8. The parasitic diode D3f has an anode connected to the back gate of the protection transistor MN8, and a cathode connected to the source/drain diffusion region on the gate side of the output transistor T1 in the protection transistor MN8.

The back gate control circuit 18 is provided between the node B and the back gate of each of the compensation transistor MN7 and the protection transistor MN8. The back gate control circuit 18 controls the back gate of each of the compensation transistor MN7 and the protection transistor MN8 according to a state of the power supply control apparatus 2. The back gate control circuit 18 includes a second switch transistor (first transistor) MN9 and the resistor R3. In the first exemplary embodiment, an N-type MOS transistor is used as the second switch transistor MN9. The second switch transistor MN9 has a drain coupled to the node B, a gate coupled to the power supply terminal PWR, and a source and a back gate coupled to the back gate of each of the compensation transistor MN7 and the protection transistor MN8 through the resistor R3.

A parasitic bipolar transistor Q4 are formed to the second switch transistor MN9 as a parasitic element. More specifically, the parasitic bipolar transistor Q4 has a base connected to the back gate of the second switch transistor MN9, an emitter connected to a drain diffusion region of the second switch transistor MN9, and a collector coupled to the power supply terminal PWR.

The resistor R3 has one terminal coupled to the source of the second switch transistor MN9, and the other terminal coupled to the back gate of each of the compensation transistor MN7 and the protection transistor MN8. Parasitic diodes D3a and D3b are formed between the both terminals of the resistor R3 and the power supply terminal PWR. More specifically, the parasitic diode D3a has an anode connected to the terminal on the source side of the second switch transistor MN9 in the resistor R3, and a cathode coupled to the power supply terminal PWR. The parasitic diode D3b has an anode connected to the other terminal of the resistor R3, and a cathode coupled to the power supply terminal PWR. The resistor R10 and the diode D10 are coupled in series between the ground terminal GND and the power supply terminal PWR. The resistor R10 has one terminal coupled to the ground terminal GND, and the other terminal coupled to the node B. The diode D10 has an anode coupled to the node B and a cathode coupled to the power supply terminal PWR. In summary, the diode D10 and the resistor R10 are coupled to each other through the node B. The resistor R11 is coupled between the ground terminal GND and the node C.

Next, operations of the power supply control apparatus 2 will be described. The operations include a mode in which the power supply 10 is normally connected, and a mode in which the power supply 10 is reversely connected (reverse connection mode). The operation performed when the power supply 10 is normally connected includes the following modes. That is, a conductive mode in which the output transistor T1 is rendered conductive and power is supplied to the load 11 through the output terminal OUT, and a negative voltage surge mode in which a negative voltage surge occurs from the load 11 to the output terminal OUT as a counter electromotive force in the turn-off when the output transistor T1 is switched from the conduction state to the non-conduction state. Hereinafter, the operations of the power supply control apparatus 2 will be described in each of the three modes.

In the conductive mode when the low-level control signal S2 is applied to the gate of the discharge transistor MN1, the discharge transistor MN1 is rendered non-conductive. On the other hand, when the high-level control signal S1 is applied to the gate of the output transistor T1, the output transistor T1 is rendered conductive. Accordingly, in the conductive mode, the voltage of the output terminal OUT is substantially equal to the positive-polarity-side voltage VB of the power supply 10. Further, in the conductive mode, the second switch transistor MN9 is rendered conductive. Thus, the voltage of the ground terminal GND is applied to the back gate of each of the protection transistor MN8 and the compensation transistor MN7 through the resistors R10 and R3. At this time, in the compensation transistor MN7, the terminal coupled to the output terminal OUT serves as a drain, and the terminal coupled to the node C serves as a source. Since the voltage of the ground terminal GND is applied to the gate of the compensation transistor MN7, the compensation transistor MN7 is rendered non-conductive. In the protection transistor MN8, the terminal coupled to the gate of the output transistor T1 serves as a drain, and the terminal coupled to the node C serves as a source. Since the voltage of the ground terminal GND is applied to the gate of the protection transistor MN8, the protection transistor MN8 is rendered non-conductive.

Since the gate voltage is lower than the source voltage in the first switch transistor MN11, the first switch transistor MN11 is rendered non-conductive. Thus, the dynamic clamping circuit 19 is deactivated. At this time, each of the parasitic diodes (D1, D2, D1a, D1b, D3a to D3f) is inversely biased, and these diodes are in the non-conduction state. Since the emitter and the base are not forwardly biased in each of the parasitic bipolar transistors (Q1, Q2, Q4, Q6 to Q9), these parasitic bipolar transistors are in the non-conduction state.

Next, the operation under the negative voltage surge mode will be described. The negative voltage surge occurs on turn-off, when the output transistor T1 is switched from the conduction state to the non-conduction state. The influences of an inductance of the load 11, and an inductance of a line that connects the load 11 cause the negative voltage surge. In this case, since the control signal S2 transits from the low level to the high level, the discharge transistor MN1 is rendered conductive. On the other hand, since the control signal S1 transits from the high level to the low level, the output transistor T1 is rendered non-conductive.

In the process in which the output transistor T1 switches from the conduction state to the non-conduction state (turn-off period), an inductance of the load 11 and an inductance of a line that connects the load 11 generate a counter electromotive voltage of the negative voltage in the output terminal OUT. In the turn-off period, when the voltage of the output terminal OUT is higher than the voltage of the ground terminal GND, the second switch transistor MN9 is rendered conductive. Thus, the voltage of the ground terminal GND is applied to the back gate of the compensation transistor MN7 through the resistors R10 and R3. The second switch transistor MN9 is rendered conductive also when the voltage of the output terminal OUT is lower than the voltage of the ground terminal GND (negative voltage surge). At this time, the current path is formed from the ground terminal GND to the output terminal OUT through the second switch transistor MN9, the resistor R3, and the parasitic diode D3$d$. In the parasitic diodes D3$a$ and D3$b$, the voltage on the cathode side is the positive-polarity-side voltage VB, and thus a forward voltage is not generated.

A forward voltage of the parasitic diode D3$d$ is controlled not to exceed the threshold voltage of the parasitic bipolar transistor Q7 by adjusting the resistance value of the resistor R3 in advance. Accordingly, the forward voltage of the parasitic diode D3$d$ is about 0.5 V, for example. The parasitic bipolar transistor Q7 has an emitter-base voltage of about 0.7 V or less, which means the parasitic bipolar transistor Q7 is rendered non-conductive. In summary, the voltage of the back gate of the compensation transistor MN7 is higher than the voltage of the output terminal OUT by about 0.5 V. At this time, in the compensation transistor MN7, the output terminal OUT side serves as the source, and the node C side serves as the drain. Since the gate voltage is higher than the source voltage in the compensation transistor MN7, the compensation transistor MN7 is rendered conductive. Thus, the voltage of the node C is equal to the voltage of the output terminal OUT. Since the voltage of the node C is equal to the voltage of the output terminal OUT, the current path is also formed in the parasitic diode D3$c$ as well. However, a forward voltage of the parasitic diode D3$c$ is about 0.5 V, as is similar to the parasitic diode D3$d$. In summary, an emitter-base voltage is about 0.7 V or less in the parasitic bipolar transistor Q6, and thus the parasitic bipolar transistor Q6 is rendered non-conductive.

When the negative voltage surge is occurred in the output terminal OUT, the gate voltage of the output transistor T1 is also the negative voltage since the discharge transistor MN1 is rendered conductive. At this time, in the protection transistor MN8 of the reverse connection protection circuit 17, the gate side of the output transistor T1 serves as the source, and the node C side serves as the drain. Since the gate voltage is higher than the source voltage in the protection transistor MN8, the protection transistor MN8 is rendered conductive. However, the voltage of the node C is short-circuited to the voltage of the output terminal OUT since the compensation transistor MN7 is rendered conductive, and thus the protection transistor MN8 is deactivated. Since the protection transistor MN8 is deactivated, the current path in which the current flows from the ground terminal GND to the output terminal OUT through the protection transistor MN8 (or parasitic diode D3$f$) and the discharge transistor MN1 is interrupted.

On the other hand, in the first switch transistor MN11 of the switch circuit 20, the gate voltage is substantially equal to the voltage of the ground terminal GND (0 V, for example), and the source (gate of the output transistor T1) voltage is negative. Thus, the first switch transistor MN11 is rendered conductive. Accordingly, the dynamic clamping circuit 19 is activated. When the source-drain voltage of the output transistor T1 reaches the clamp voltage or more due to the decrease in the voltage of the output terminal OUT, the diode D11 provided in the dynamic clamping circuit 19 is conducted, and the output transistor T1 is rendered conductive. Here, the clamp voltage is the sum of the threshold voltage of the output transistor T1, the threshold voltage of the first switch transistor MN11, and the breakdown voltage of the diode D11. As described above, when the negative voltage is generated in the output terminal OUT, the power supply control apparatus 2 according to the first exemplary embodiment clamps the drain-source voltage of the output transistor T1 to the clamp voltage without being influenced by the current from the reverse connection protection circuit 17. Accordingly, the power supply control apparatus 2 according to the first exemplary embodiment protects the output transistor T1 against overvoltage with high accuracy.

The negative voltage surge is generated until when the energy stored in the inductance is released. When the release of the energy is completed, the voltage of the output terminal OUT becomes 0 V. After that, the output transistor T1 is rendered non-conductive.

Figure 2:
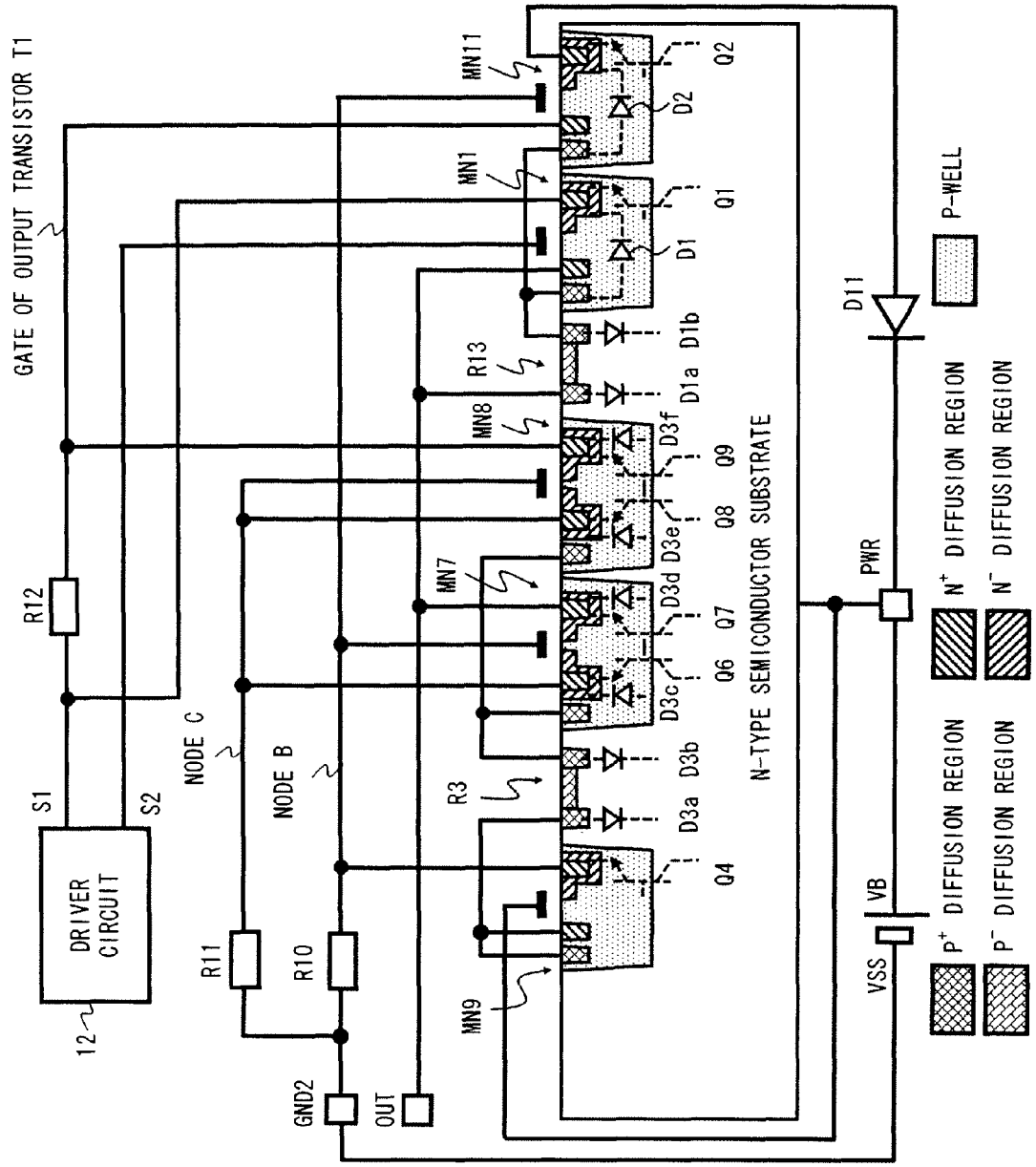
FIG. 2 is a sectional view of a semiconductor device illustrating parasitic elements formed in the power supply control apparatus according to the first exemplary embodiment of the present invention.

FIG. 2 shows a sectional view of the gate discharge circuit 13, the compensation circuit 16, the back gate control circuit 18, the switch circuit 20, the resistor R3, and the resistor R13 for the purpose of specifically explaining parasitic elements. The sectional view shown in FIG. 2 shows an example in which the gate discharge circuit 13, the compensation circuit 16, the back gate control circuit 18, the switch circuit 20, the resistor R3, and the resistor R13 are formed in one N-type semiconductor substrate. As an example, the resistor R3 and the resistor R13 are diffusion resistors.

As shown in FIG. 2, the resistor R3 is formed on the N-type semiconductor substrate using P-type diffusion regions. In the example shown in FIG. 2, resistor connecting terminals are formed at both ends of the resistor R3 using $P^+$ diffusion regions having a high impurity concentration. Further, a resistor portion is formed using a $P^-$ diffusion region having a low impurity concentration which connects the connecting terminals. Further, the resistor R13 is formed of an element having substantially the same structure as the resistor R3.

The discharge transistor MN1 of the gate discharge circuit 13 has a P-well (hereinafter referred to as "back gate of the discharge transistor MN1" if necessary) which is made of a P-type semiconductor and is formed on the N-type semiconductor substrate. In the P-well, the discharge transistor MN1 includes a $P^+$ diffusion region and $N^+$ diffusion regions. The $P^+$ diffusion region serves as a potential supply terminal for supplying a potential as a back gate voltage of the discharge transistor MN1 to the P-well. The $N^+$ diffusion regions form a source region and a drain region of the discharge transistor MN1. On the periphery of the $N^+$ diffusion region forming the drain, an $N^-$ diffusion region having a low impurity concentration is formed. The $N^-$ diffusion region provides a high breakdown voltage between the drain and the back gate. Further, above an upper layer of the N-type semiconductor substrate, in a region extending over two $N^+$ diffusion regions, a gate electrode is formed via a gate oxide film.

Each of the first switch transistor MN11 of the switch circuit 20, the compensation transistor MN7 of the compensation circuit 16, the protection transistor MN8 of the reverse connection protection circuit 17, and the second switch transistor MN9 of the back gate control circuit 18 is formed of an element having substantially the same structure as the discharge transistor MN1. However, in the compensation transistor MN7 and the protection transistor MN8, an $N^-$ diffusion region is formed on the periphery of any $N^+$ diffusion region forming the source and the drain, and the breakdown voltage between the drain and the back gate and that between the source and the back gate are high.

The parasitic bipolar transistor Q1 has a base serving as the back gate of the discharge transistor MN1, an emitter serving as the $N^+$ diffusion region on the gate side of the output transistor T1 in the discharge transistor MN1, and a collector serving as the N-type semiconductor substrate. The parasitic bipolar transistor Q2 has a base serving as the back gate of the first switch transistor MN11, an emitter serving as the $N^+$ diffusion region on the anode side of the diode D11 in the first switch transistor MN11, and a collector serving as the N-type semiconductor substrate.

The parasitic bipolar transistor Q4 has a base serving as the back gate of the second switch transistor MN9, an emitter serving as the $N^+$ diffusion region coupled to the node B in the second switch transistor MN9, and a collector serving as the N-type semiconductor substrate. The parasitic bipolar transistor Q6 has a base serving as the back gate of the compensation transistor MN7, an emitter serving as the $N^+$ diffusion region coupled to the node C in the compensation transistor MN7, and a collector serving as the N-type semiconductor substrate. The parasitic bipolar transistor Q7 has a base serving as the back gate of the compensation transistor MN7, an emitter serving as the $N^+$ diffusion region coupled to the output terminal OUT in the compensation transistor MN7, and a collector serving as the N-type semiconductor substrate.

The parasitic bipolar transistor Q8 has a base serving as the back gate of the protection transistor MN8, an emitter serving as the $N^+$ diffusion region coupled to the node C in the protection transistor MN8, and a collector serving as the N-type semiconductor substrate. The parasitic bipolar transistor Q9 has a base serving as the back gate of the protection transistor MN8, an emitter serving as the $N^+$ diffusion region coupled to the gate of the output transistor T1 in the protection transistor MN8, and a collector serving as the N-type semiconductor substrate.

The parasitic diode D1 has an anode serving as the back gate of the discharge transistor MN1, and a cathode serving as the $N^+$ diffusion region coupled to the gate of the output transistor T1 in the discharge transistor MN1. The parasitic diode D2 has an anode serving as the back gate of the first switch transistor MN11, and a cathode serving as the $N^+$ diffusion region coupled to the anode of the diode D11 in the first switch transistor MN11. The parasitic diode D1a has an anode serving as the $P^+$ diffusion region coupled to the output terminal OUT in the resistor R13, and a cathode serving as the N-type semiconductor substrate. The parasitic diode D1b has an anode serving as the $P^+$ diffusion region coupled to the back gate of the first switch transistor MN11 in the resistor R13, and a cathode serving as the N-type semiconductor substrate.

The parasitic diode D3a has an anode serving as the $P^+$ diffusion region coupled to the back gate of the second switch transistor MN9 in the resistor R3, and a cathode serving as the N-type semiconductor substrate. The parasitic diode D3b has an anode serving as the $P^+$ diffusion region coupled to the back gate of the compensation transistor MN7 in the resistor R3, and a cathode serving as the N-type semiconductor substrate. The parasitic diode D3c has an anode serving as the back gate of the compensation transistor MN7, and a cathode serving as the $N^+$ diffusion region coupled to the node C in the compensation transistor MN7. The parasitic diode D3d has an anode serving as the back gate of the compensation transistor MN7, and a cathode serving as the $N^+$ diffusion region coupled to the output terminal OUT in the compensation transistor MN7. The parasitic diode D3e has an anode serving as the back gate of the protection transistor MN8, and a cathode serving as the $N^+$ diffusion region coupled to the node C in the protection transistor MN8. The parasitic diode D3f has an anode serving as the back gate of the protection transistor MN8, and a cathode serving as the $N^+$ diffusion region coupled to the gate of the output transistor T1 in the protection transistor MN8.

In a typical NPN bipolar transistor, a breakdown voltage between a collector and an emitter thereof when a base of the NPN bipolar transistor is supplied with a fixed potential is higher than that when the base is open. In the related art, the base of the parasitic bipolar transistor may be open. Thus, in the related art, there is a possibility that the breakdown voltage BVceo between the collector and the emitter of the parasitic bipolar transistor decreases to a maximum applied voltage of the power supply 10 or lower.

In the first exemplary embodiment, a fixed potential is applied to the base of each of the parasitic bipolar transistors Q4, Q6, Q7, Q8, and Q9. As a result, the parasitic bipolar transistors Q4, Q6, Q7, Q8, and Q9 have a high breakdown voltage between the collector and the emitter thereof. The device is designed in advance such that the breakdown voltage between the collector and the emitter of each parasitic bipolar transistor at this time becomes higher than the maximum applied voltage of the power supply 10. Accordingly, the parasitic bipolar transistors Q4, Q6, Q7, Q8, and Q9 maintain the non-conduction state until the maximum applied voltage of the power supply 10 is reached.

As shown in FIGS. 1 and 2, the bases of the parasitic bipolar transistors Q4, Q6, Q7, Q8, and Q9 are each coupled to the wiring line of the back gates of the compensation transistor MN7 and the protection transistor MN8. Further, when the power supply control apparatus 2 is in a standby state (in the standby state in which no power is supplied from the output transistor T1 to the load 11), the second switch transistor MN9 is rendered conductive. At this time, the bases of the parasitic bipolar transistors Q4, Q6, Q7, Q8, and Q9 are each supplied with the negative-polarity-side voltage VSS of the power supply 10 through the ground terminal GND. This allows the parasitic bipolar transistors Q4, Q6, Q7, Q8, and Q9 to maintain the non-conduction state until the maximum applied voltage is reached. That is, since no current flows through the parasitic bipolar transistors, the power supply control apparatus 2 can suppress an increase in consumption current.

Figure 3:
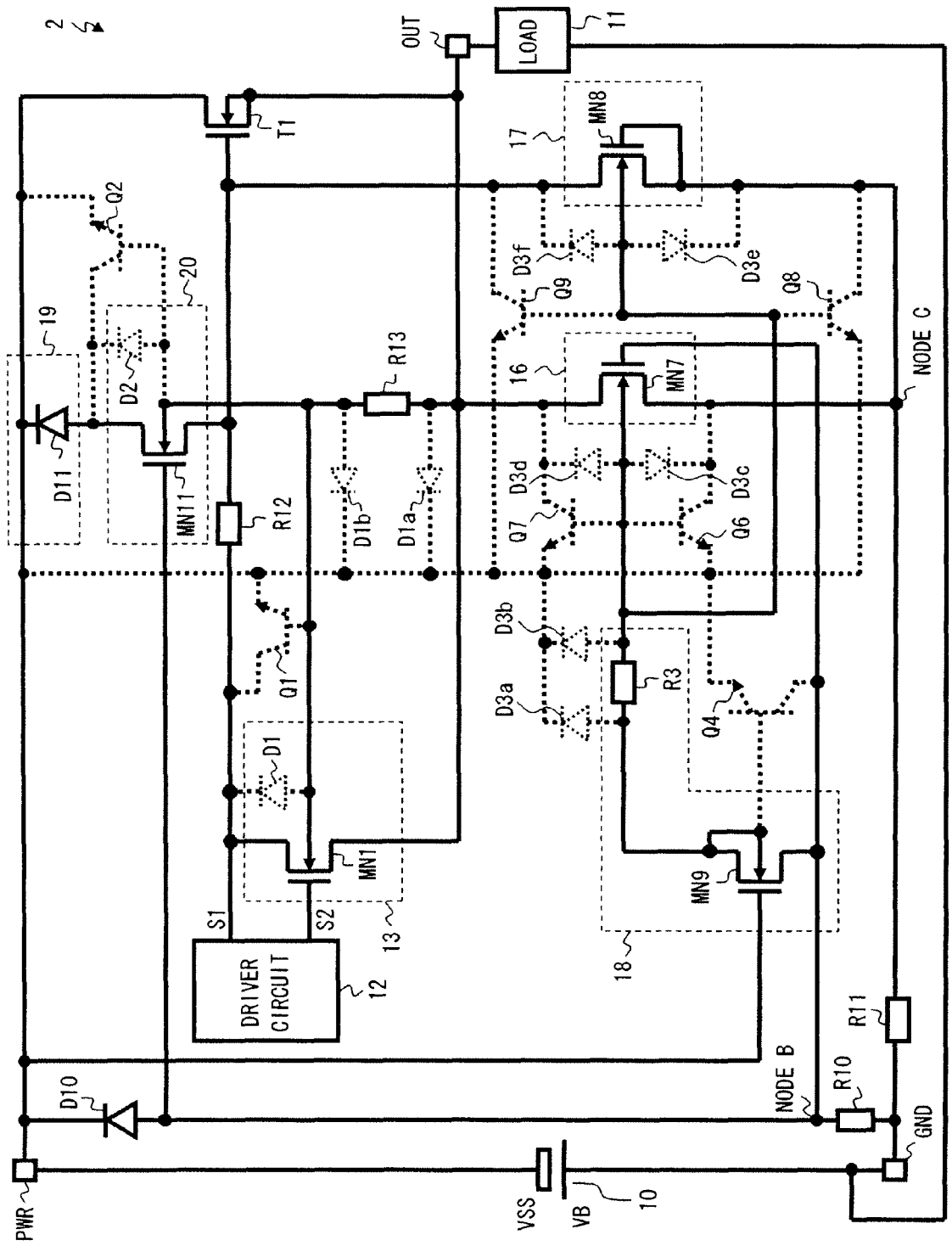
FIG. 3 is a circuit diagram showing a case where a power supply is reversely connected in the power supply control apparatus according to the first exemplary embodiment of the present invention.
Figure 4:
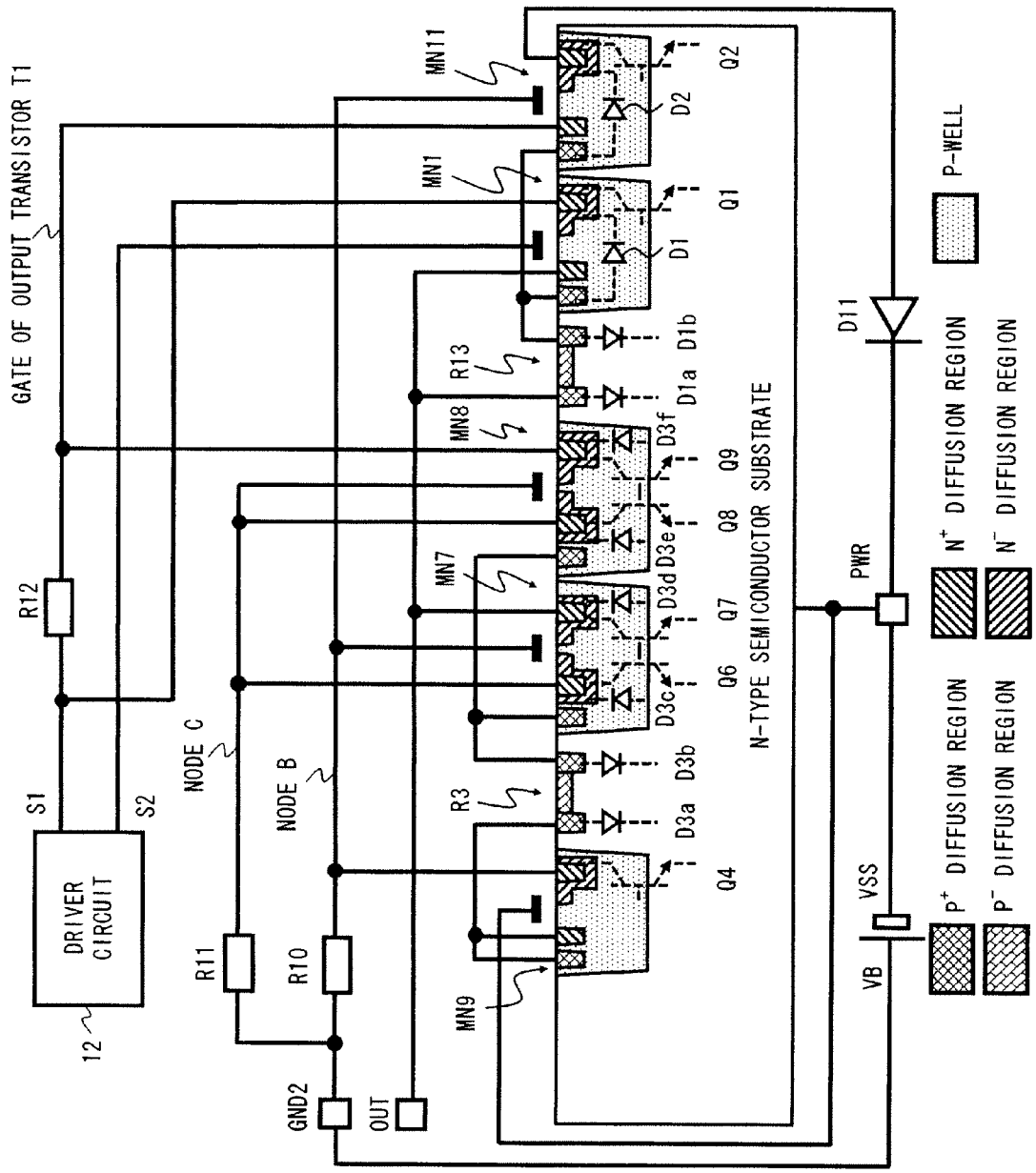
FIG. 4 is a sectional view of the semiconductor device illustrating the parasitic elements formed in the power supply control apparatus according to the first exemplary embodiment of the present invention.

Next, an operation under the reverse connection mode will be described. FIG. 3 shows a circuit diagram showing a case where the power supply control apparatus 2 according to the first exemplary embodiment is reversely connected. Further, FIG. 4 shows a sectional view for describing the parasitic elements of the power supply control apparatus 2 in the reverse connection mode in more detail. In the reverse connection mode, the connection of the positive-polarity-side voltage VB and the negative-polarity-side voltage VSS of the power supply 10 is opposite to each other. This makes the emitter and the collector of each of the parasitic bipolar transistors Q4, Q6, Q7, Q8, and Q9 opposite to each other. This is because the high-potential side and the low-potential side are reversed since the power supply 10 is reversely connected. Each parasitic bipolar transistor has different emitter and collector compared with the case in which the power supply 10 is normally connected, while each parasitic bipolar transistor is denoted by the same signal as the case in which the power supply 10 is normally connected.

In the reverse connection mode, the positive-polarity-side voltage VB is coupled to the ground terminal GND, and the negative-polarity-side voltage VSS is coupled to the power supply PWR. Since the current flows from the ground terminal GND to the power supply terminal PWR through the diode D10, the voltage of the node B is the forward voltage of the diode D10 (0.7 V, for example). Further, the current flows from the ground terminal GND to the power supply terminal PWR through the load 11 and the diode between the back gate and the drain of the output transistor T1. Hence, the voltage of the output terminal OUT is the forward voltage (0.7 V, for example) of the parasitic diode of the output transistor T1 (diode between the back gate and the drain). In the power supply control apparatus 2, when the protection transistor MN8 is rendered conductive, electric charges are supplied from the ground terminal GND having the positive-polarity-side voltage VB to the gate of the output transistor T1. Hence, the output transistor T1 is rendered conductive. In summary, the power supply control apparatus 2 is able to suppress heat generation of the output transistor T1 and to prevent breakdown of the power supply control apparatus.

Since the negative-polarity-side voltage VSS is supplied to the gate of the second switch transistor MN9, the second switch transistor MN9 is rendered non-conductive. At this time, the voltage of the node B is equal to the voltage of the output terminal OUT (0.7 V, for example), and thus the voltage of 0.7 V is supplied as the back gate voltage to each of the compensation transistor MN7 and the protection transistor MN8. At this time, in the compensation transistor MN7, the output terminal OUT side serves as the source, and the node C side serves as the drain. Since the gate voltage and the source voltage are equal to each other in the compensation transistor MN7, the compensation transistor MN7 is rendered non-conductive. In the protection transistor MN8, the gate side of the output transistor T1 serves as the source, and the node C side serves as the drain. Since the gate voltage and the drain voltage are equal to each other in the protection transistor MN8, the protection transistor MN8 is rendered conductive. Hence, electric charges are supplied from the ground terminal GND to the gate of the output transistor T1 through the protection transistor MN8, and the output transistor T1 is rendered conductive.

In the reverse connection mode, current paths are formed from the ground terminal GND to the power supply terminal PWR through the load 11 and the parasitic diode D1 and through the load 11 and the parasitic diode D2. Further, a current path is formed from the ground terminal GND to the power supply terminal PWR through the parasitic diodes D1a and D1b. Due to the decrease in the voltage of the resistor R13, the amount of current flowing through the parasitic diode D1b is smaller than the amount of current flowing through the parasitic diode D1a. Thus, the voltage of about 0.7 V is generated in the parasitic diode D1a as the forward voltage, while the voltage of about 0.5 V is generated in the parasitic diode D1b as the forward voltage. Therefore, the forward voltage of the parasitic diodes D1 and D2 is also about 0.5 V. Thus, the parasitic bipolar transistors Q1 and Q2 are in the non-conduction state. In summary, the electric charges supplied to the gate of the output transistor T1 are not drawn by the parasitic transistors Q1 and Q2, and the conduction state of the output transistor T1 is maintained.

From the above description, the power supply control apparatus 2 according to the first exemplary embodiment renders the output transistor T1 conductive when the negative voltage is occurred in the turn-off period, thereby protecting the output transistor T1 from overvoltage with high accuracy. Further, the power supply control apparatus 2 renders the output transistor T1 conductive when the power supply 10 is reversely connected, thereby suppressing heat generation of the output transistor T1 and preventing breakdown of the power supply control apparatus 2. Further, the power supply control apparatus 2 makes the second switch transistor MN9 conductive in the standby state when the power supply 10 is normally connected, so that the fixed potential from the ground terminal GND is supplied to the back gate of each of the compensation transistor MN7 and the protection transistor MN8. Accordingly, the breakdown voltage between the collector and the emitter of each of the parasitic bipolar transistors is maintained at the maximum applied voltage of the power supply 10 or higher. In other words, the power supply control apparatus 2 according to the first exemplary embodiment maintains the parasitic bipolar transistors in the non-conduction state even when the power supply 10 applies a high voltage. Consequently, the power supply control apparatus 2 can suppress an increase in consumption current.

Second Exemplary Embodiment

Figure 5:
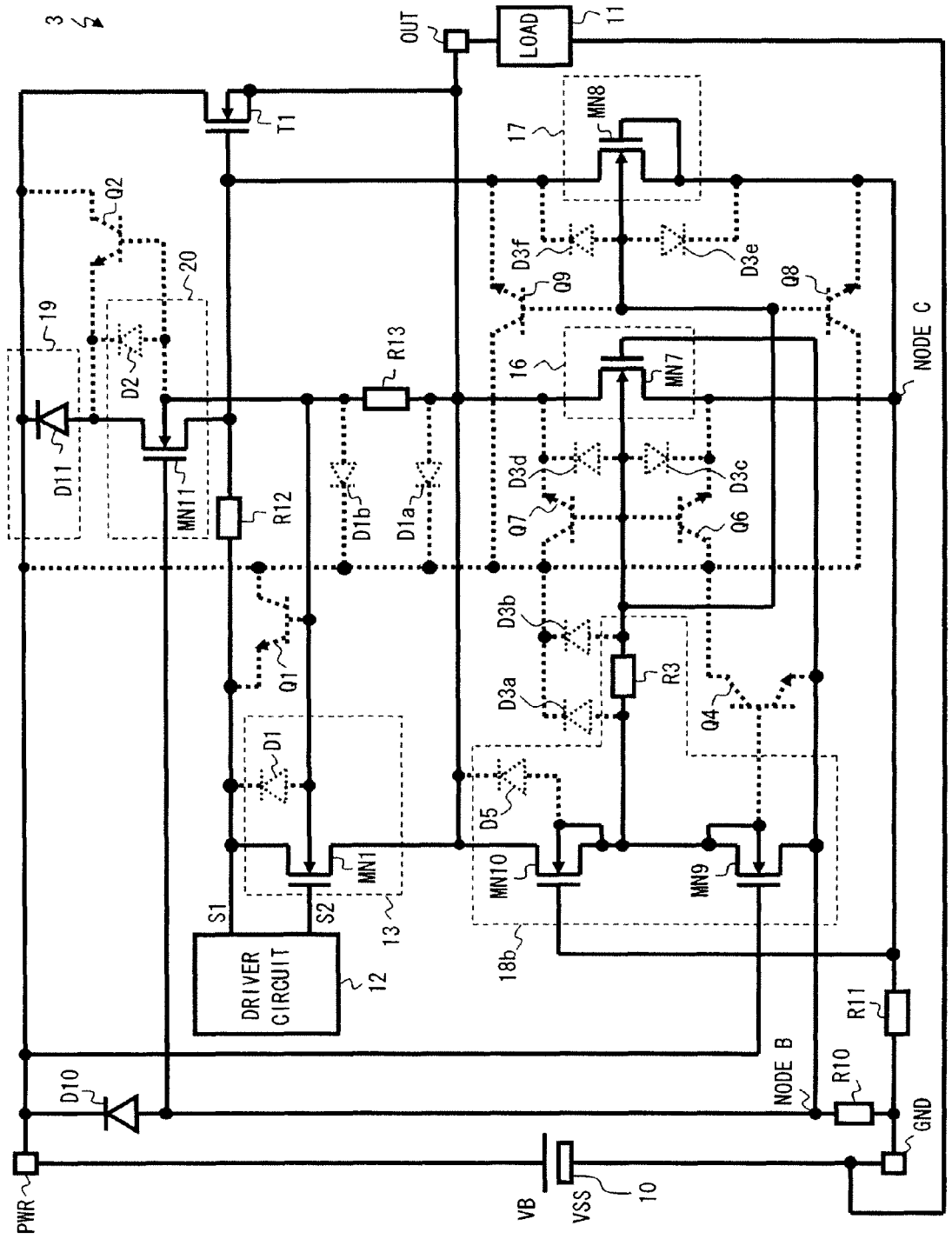
FIG. 5 is a circuit diagram of a power supply control apparatus according to a second exemplary embodiment of the present invention.
Figure 6:
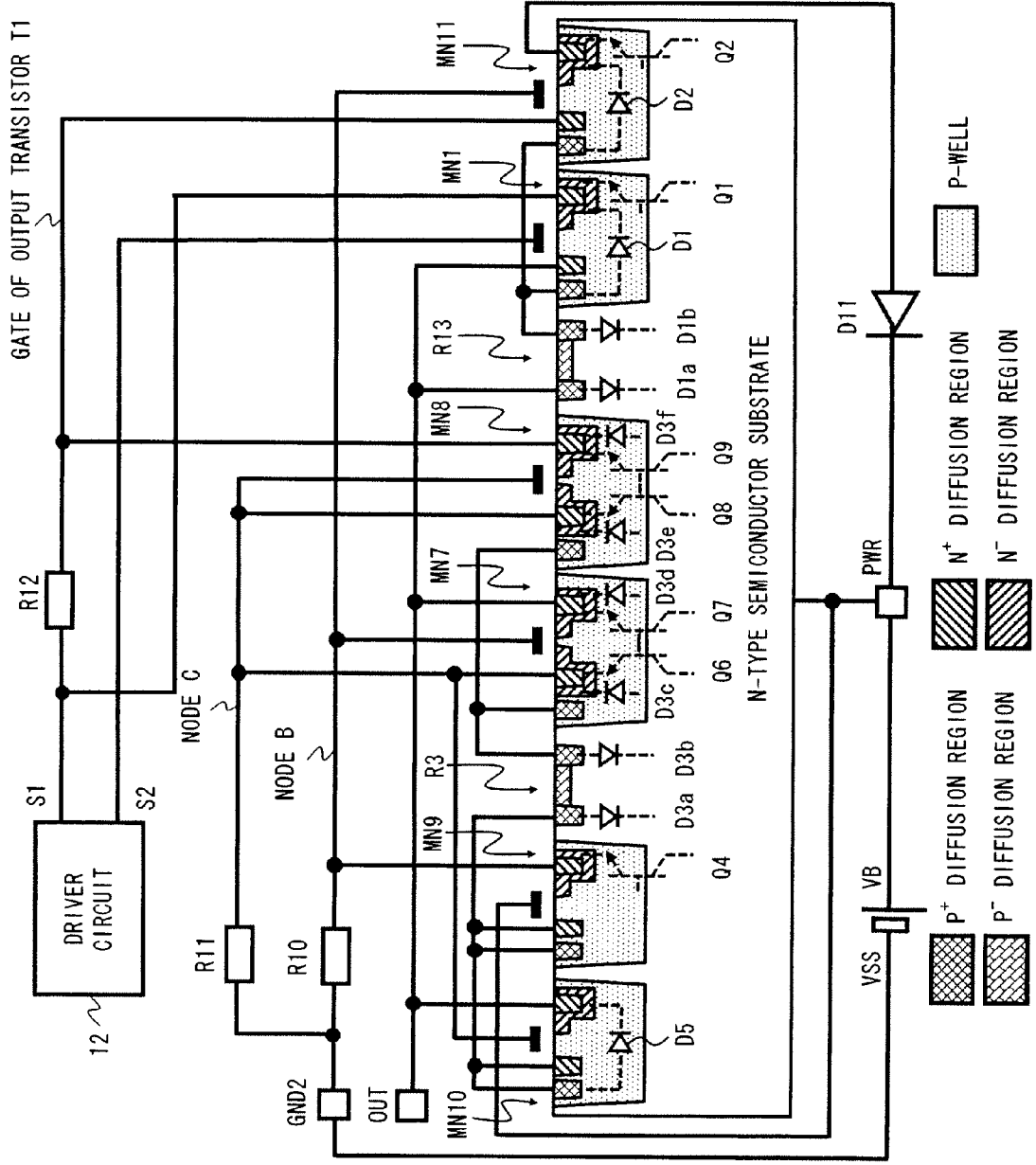
FIG. 6 is a sectional view of a semiconductor device illustrating parasitic elements formed in the power supply control apparatus according to the second exemplary embodiment of the present invention.
Figure 7:
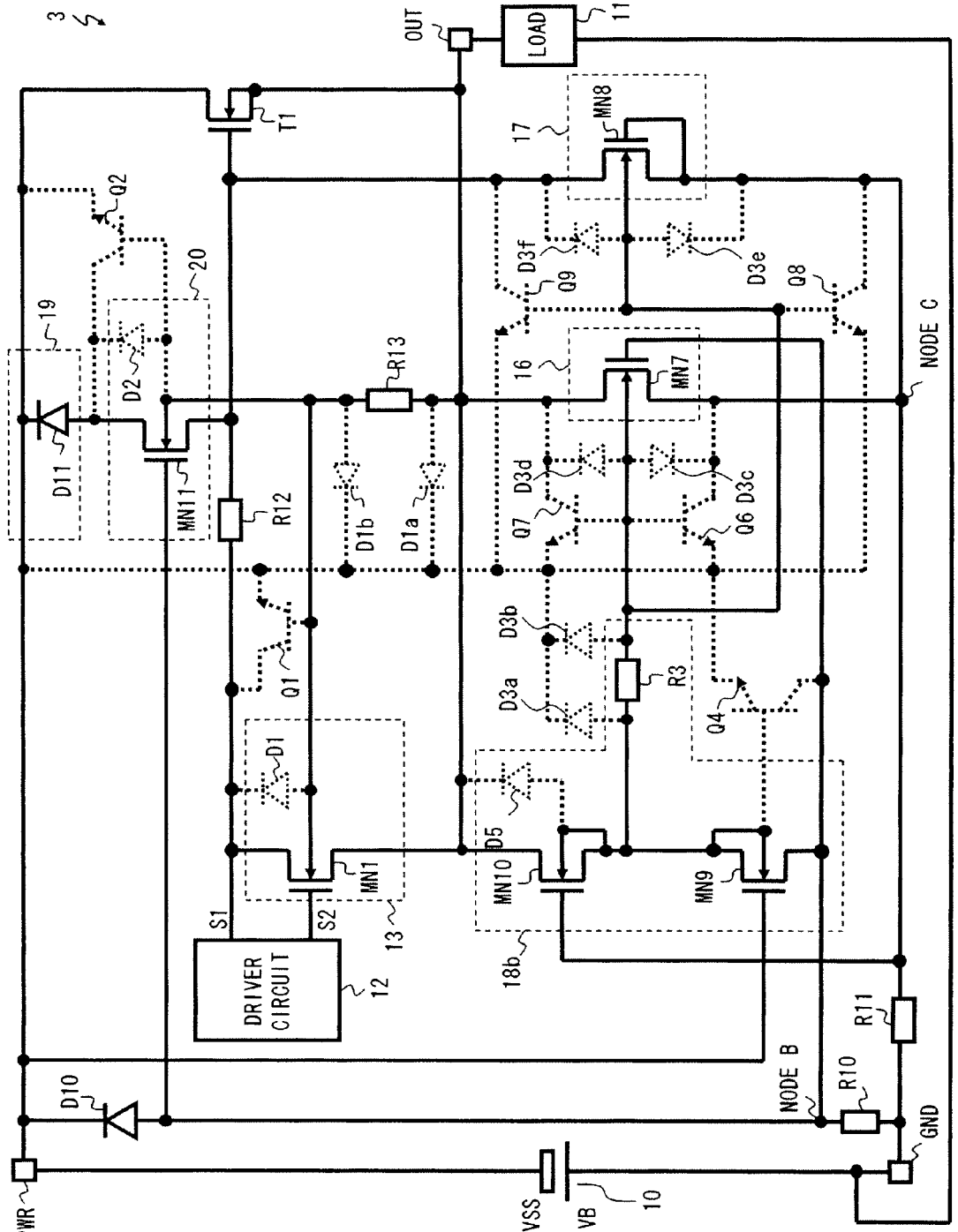
FIG. 7 is a circuit diagram showing a case where a power supply is reversely connected in the power supply control apparatus according to the second exemplary embodiment of the present invention.
Figure 8:
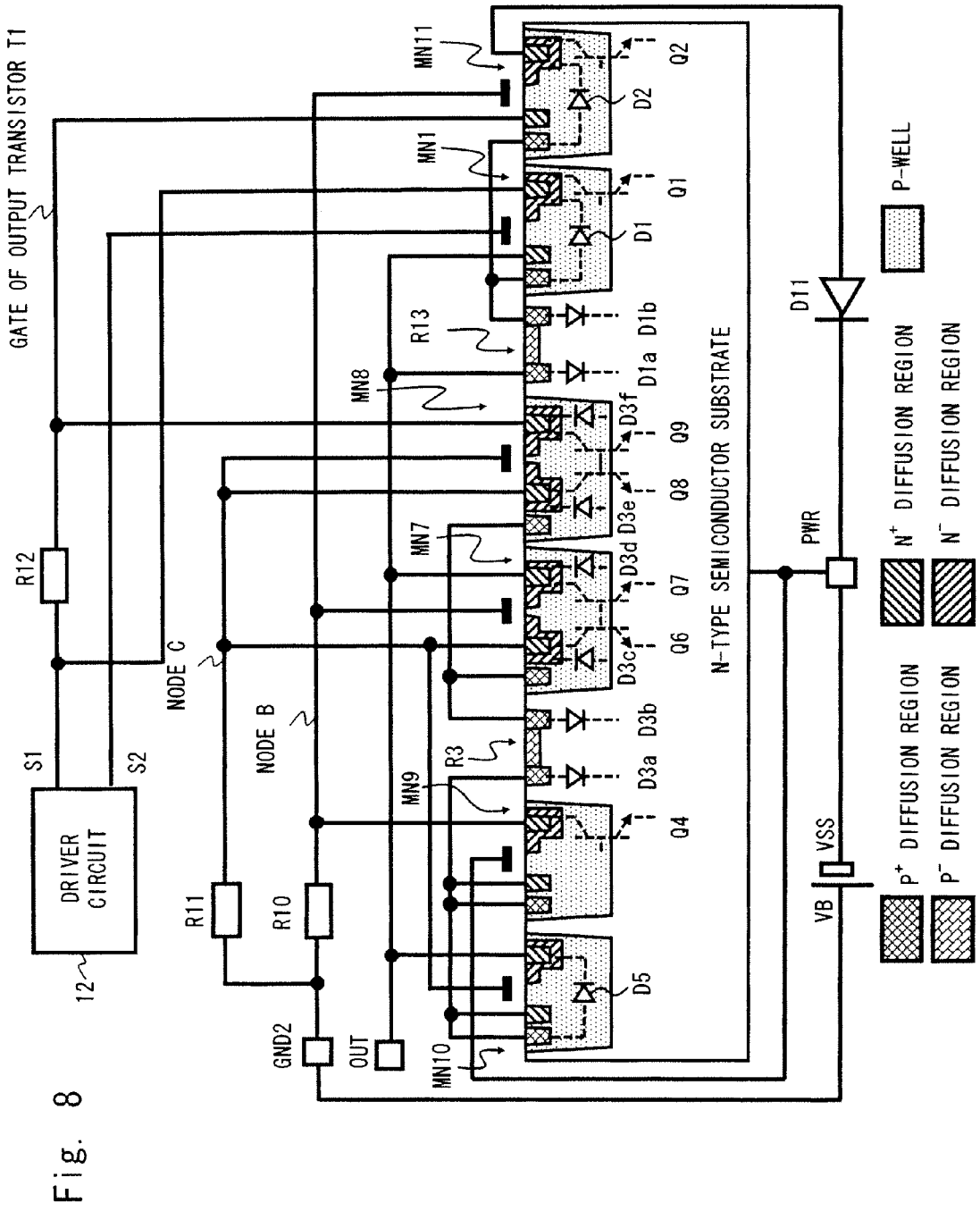
FIG. 8 is a sectional view of the semiconductor device illustrating the parasitic elements formed in the power supply control apparatus according to the second exemplary embodiment of the present invention.

FIG. 5 shows a circuit diagram of a power supply control apparatus 3 according to a second exemplary embodiment. Further, FIG. 6 shows a sectional view of devices that constitute the power supply control apparatus 3 according to the second exemplary embodiment. Further, FIG. 7 shows a circuit diagram of the power supply control apparatus 3 when the power supply is reversely connected, and FIG. 8 shows a sectional view of devices that constitute the power supply control apparatus 3. The power supply control apparatus 3 includes, as a variant example of the back gate control circuit 18 of the power supply control apparatus 2, a back gate control circuit 18b. The components of the power supply control apparatus 3 that are similar to those of the power supply control apparatus 2 are denoted by the same reference symbols as the power supply control apparatus 2, and the description thereof will be omitted.

Compared with the back gate control circuit 18 of the power supply control apparatus 2, the back gate control circuit 18b of the power supply control apparatus 3 causes the back gate of each of the compensation transistor MN7 and the protection transistor MN8 to be short-circuited to the potential of the output terminal OUT with a low impedance in the reverse connection mode, thereby obtaining a more stable operation.

The back gate control circuit 18b of the power supply control apparatus 3 further includes a third switch transistor (second transistor) MN10 in addition to the second switch transistor MN9. In the second exemplary embodiment, an N-type MOS transistor is used as the third switch transistor MN10. The third switch transistor MN10 has a gate coupled to the node C, a drain coupled to the output terminal OUT, and a source and a back gate coupled to the source and the back gate of the second switch transistor MN9.

The third switch transistor MN10 is formed of elements having substantially the same structure as the discharge transistor MN1. A parasitic diode D5 is formed to the third switch transistor MN10 as a parasitic element. More specifically, the parasitic diode D5 has an anode connected to the back gate of the third switch transistor MN10, and a cathode connected to a drain diffusion region in the output terminal OUT side in the third switch transistor MN10.

Next, an operation of the power supply control apparatus 3 will be described. When the power supply 10 is normally connected, the third N-type MOS transistor MN10 is rendered non-conductive. Specifically, the operation of the power supply control apparatus 3 is substantially the same to the operation of the power supply control apparatus 2, and thus the description thereof will be omitted.

In the reverse connection mode, the third switch transistor MN10 has a gate (node C) of a high potential, a drain of about 0.7 V (output terminal OUT), and a source and a back gate of about 0.7 V, and thus the third switch transistor MN10 is rendered conductive. The back gate of each of the compensation transistor MN7 and the protection transistor MN8 is equal to the voltage of the output terminal OUT since the third N-type MOS transistor MN10 is rendered conductive. In summary, the power supply control apparatus according to the second exemplary embodiment supplies the voltage of the output terminal OUT to the back gate of each of the compensation transistor MN7 and the protection transistor MN8 in a low impedance in the reverse connection mode. Accordingly, the power supply control apparatus according to the second exemplary embodiment is able to render the protection transistor MN8 and the output transistor T1 conductive. In this manner, the same effects as those of the first exemplary embodiment can be obtained also in the power supply control apparatus 3 according to the second exemplary embodiment.

Third Exemplary Embodiment

Figure 9:
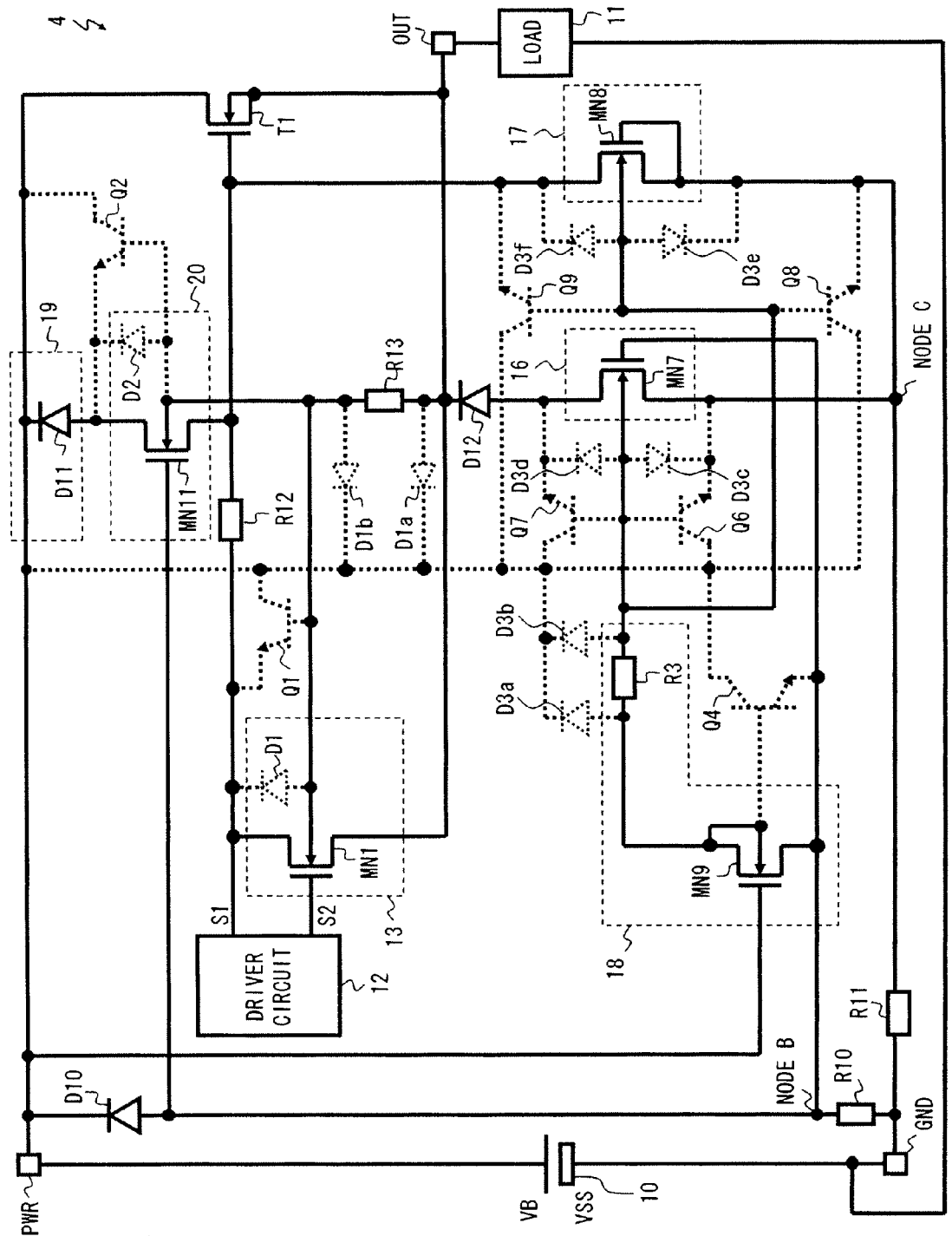
FIG. 9 is a circuit diagram of a power supply control apparatus according to a third exemplary embodiment of the present invention.

FIG. 9 shows a circuit diagram of a power supply control apparatus 4 according to a third exemplary embodiment. The power supply control apparatus 4 further includes a diode D12 between the output terminal OUT and the source/drain on the output terminal OUT side of the compensation transistor MN7 compared with the power supply control apparatus 2. More specifically, the diode D12 has an anode coupled to the source/drain on the output terminal OUT side of the compensation transistor MN7, and a cathode coupled to the output terminal OUT. The power supply control apparatus 4 is able to definitely make the compensation circuit 16 non-conductive when the power supply 10 is reversely connected and suppressing heat generation in the output transistor T1 with high accuracy, and preventing breakdown of the power supply control apparatus 4.

Next, operations of the power supply control apparatus 4 will be described. In the normal operation mode, the compensation transistor MN7 is rendered non-conductive and the diode D12 is rendered non-conductive as well. The operation of the power supply control apparatus 4 in the normal state is substantially the same to the operation of the power supply control apparatus 2 in the normal operation mode, and thus the description thereof will be omitted.

Further, as is similar to the first exemplary embodiment, in the operation of the negative voltage surge mode, by adjusting a resistance value of the resistor R3 in advance, the voltage of the back gate of the compensation transistor MN7 is set to a voltage which is higher than the voltage of the output terminal OUT by about 0.5 V. Accordingly, the compensation transistor MN7 is rendered conductive. The voltage of the node C indicates a low voltage according to the voltage of the output terminal OUT. As a result, the protection transistor MN8 is deactivated as is similar to the first exemplary embodiment. Accordingly, a current path from the ground terminal GND to the output terminal OUT through the protection transistor MN8 (or parasitic diode D3f) and the discharge transistor MN1 is interrupted. Accordingly, the power supply control apparatus 4 protects the output transistor T1 from overvoltage with high accuracy in the negative voltage surge mode without being influenced by the current from the reverse connection protection circuit 17.

Next, the reverse connection mode will be described. In the power supply control apparatus 2 shown in the first exemplary embodiment, in the reverse connection mode, the compensation transistor MN7 has a gate having a voltage of about 0.7 V (forward voltage of the diode D10), and a back gate having a voltage of the output terminal OUT. Although the voltage of the output terminal OUT is about 0.7 V (forward voltage of the parasitic diode of the output transistor T1), the voltage of the output terminal OUT becomes smaller than 0.7 V when the output transistor T1 is rendered conductive as a result of conduction in the protection transistor MN8 (for example, the voltage of the output terminal OUT is 0.1 V when an ON resistance of the output transistor T1 is 20 mΩ and a current flowed from the load is 5 A). Thus, the gate-source voltage of the compensation transistor MN7 is about 0.6 V. Now, when the threshold voltage of the compensation transistor MN7 is lower than 0.6 V, the compensation transistor MN7 is rendered conductive, and the node C and the output terminal OUT are short-circuited. Thus, the protection transistor MN8 is deactivated. Thus, a current path from the ground terminal GND to the gate of the output transistor T1 is interrupted, and it may be difficult to maintain the conduction state of the output transistor T1.

On the other hand, in the power supply control apparatus 4 according to the third exemplary embodiment, in the reverse connection mode, the voltage on the anode side of the diode D12 is higher than the voltage of the output terminal OUT by about 0.7 V. Specifically, the gate-source voltage of the compensation transistor MN7 is substantially 0 V. Thus, the protection transistor MN8 is rendered conductive. Thus, electric charges are supplied from the ground terminal GND to the gate of the output transistor T1, and thus the conduction state of the output transistor T1 can be maintained.

Fourth Exemplary Embodiment

Figure 10:
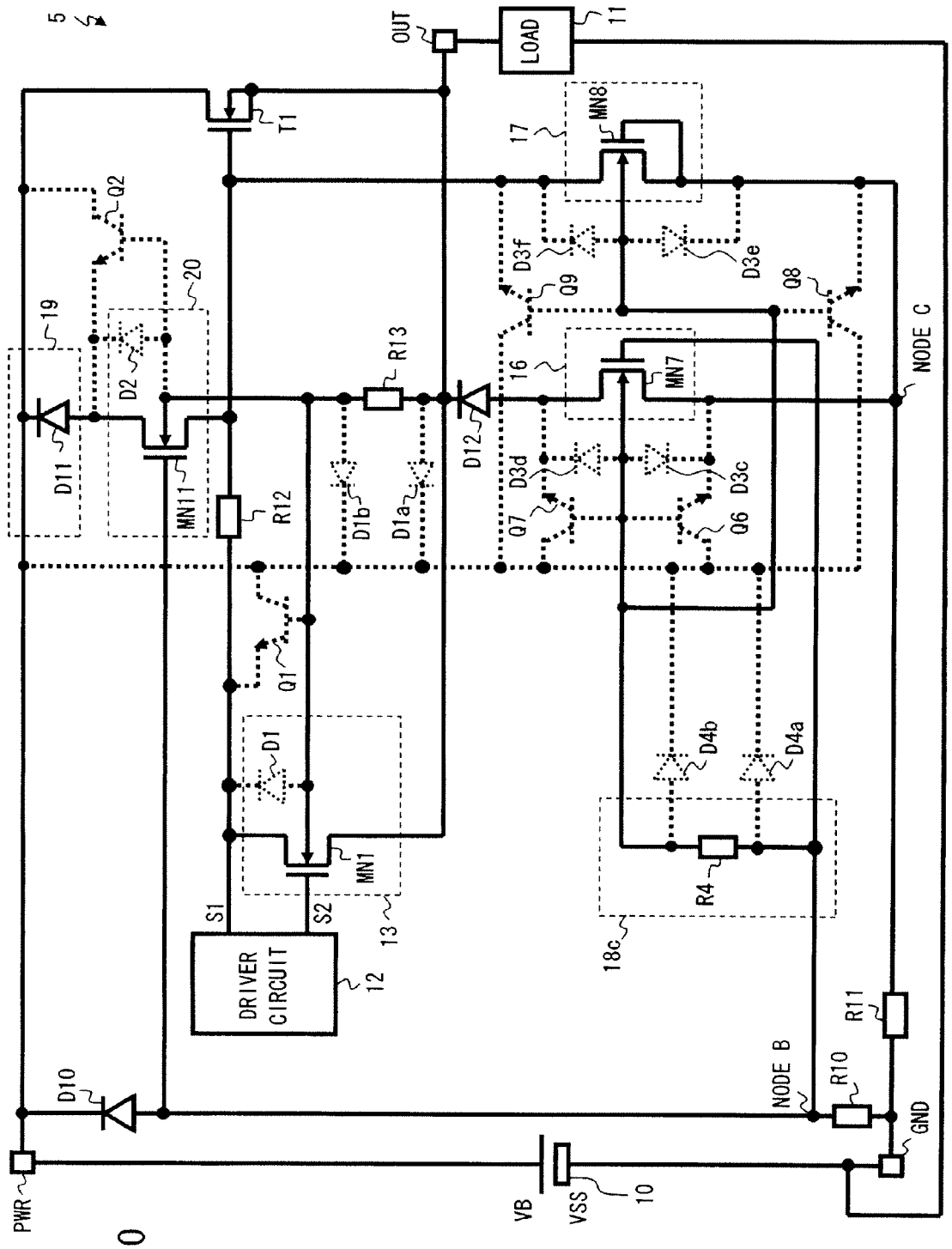
FIG. 10 is a circuit diagram of a power supply control apparatus according to a fourth exemplary embodiment of the present invention.
Figure 11:
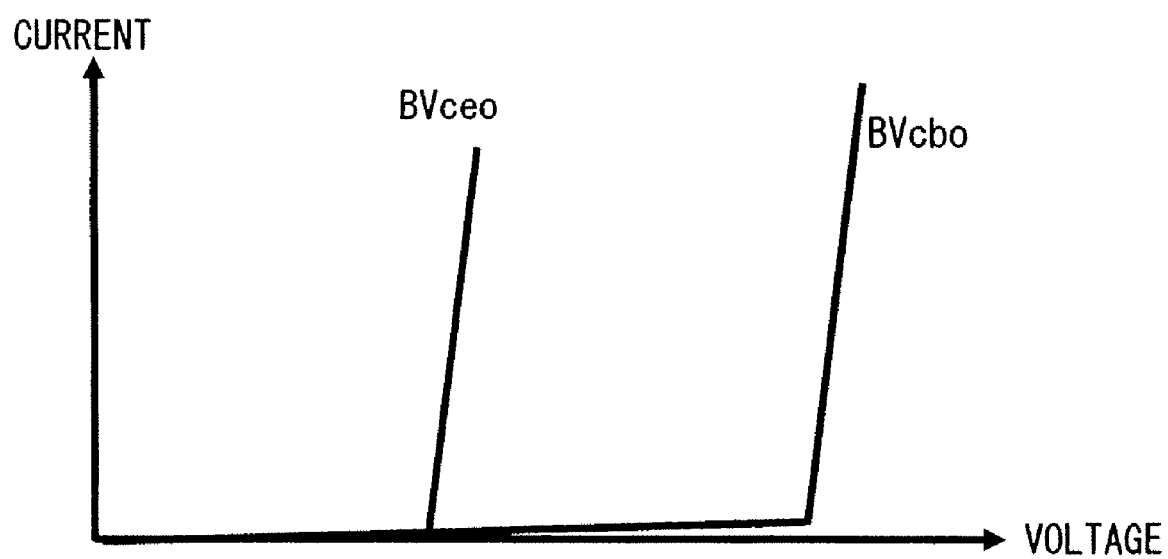
FIG. 11 is a diagram showing breakdown voltage characteristics of a bipolar transistor.
Figure 12:
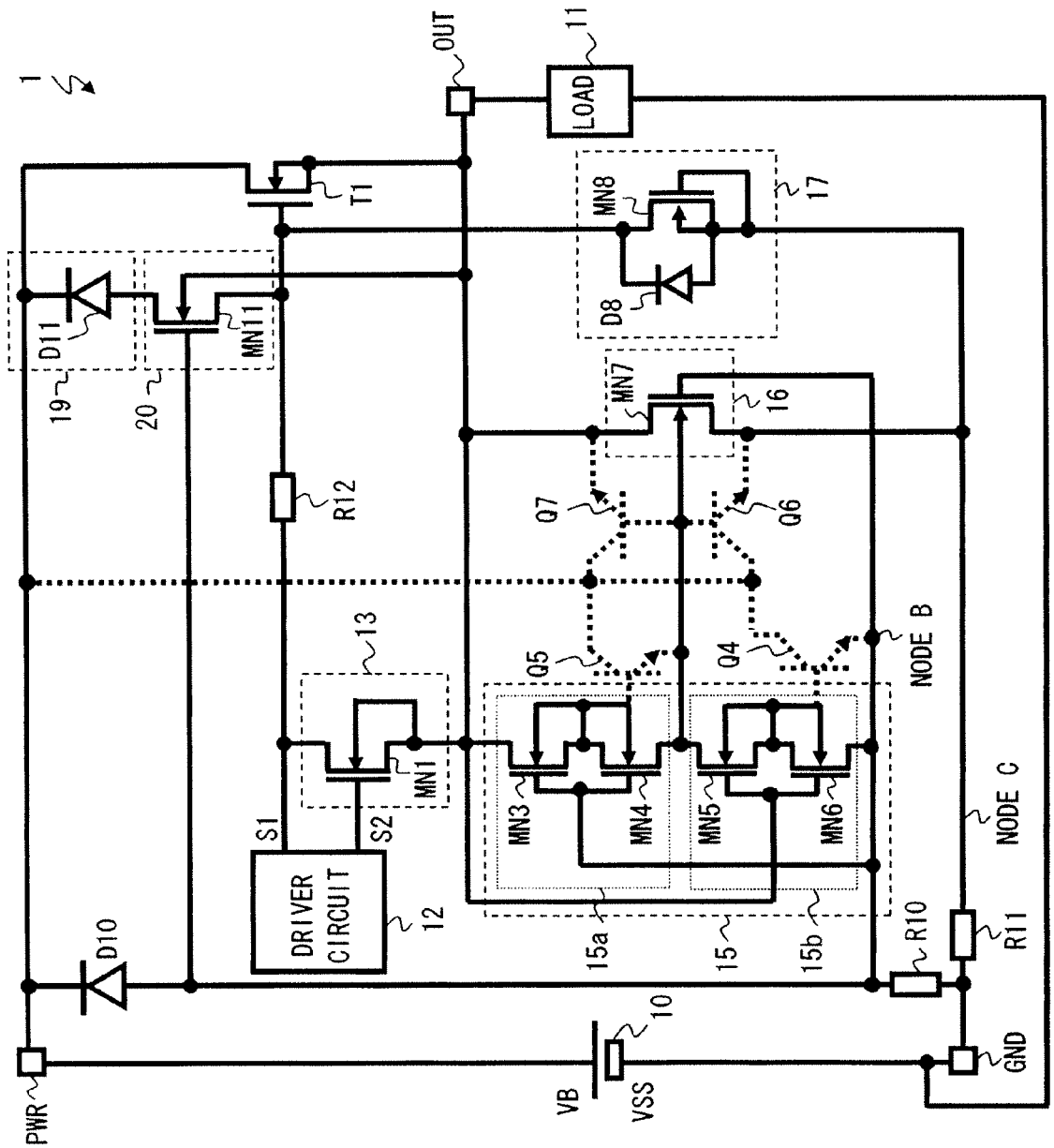
FIG. 12 is a circuit diagram of a power supply control apparatus according to a prior art.

FIG. 10 shows a circuit diagram of a power supply control apparatus 5 according to a fourth exemplary embodiment. In the power supply control apparatus 5, the second switch transistor MN9 of the back gate control circuit 18 in the power supply control apparatus 4 is replaced by a resistor (first resistor) R4, thereby achieving functions with fewer number of component elements than the power supply control apparatus 2. Further, in this case, the resistor R3, which is the component element of the power supply control apparatus 4, is unnecessary. The resistor R4 is, for example, a diffusion resistor.

A back gate control circuit 18c provided in the power supply control apparatus 5 includes the resistor R4. The resistor R4 has one terminal coupled to the node B, and the other terminal coupled to the back gate of each of the compensation transistor MN7 and the protection transistor MN8. Further, the resistor R4 includes parasitic diodes D4a and D4b. More specifically, the parasitic diode D4a has an anode connected to the terminal on the node B side of the resistor R14, and a cathode coupled to the power supply terminal PWR. The parasitic diode D4b has an anode connected to the other terminal of the resistor R4 and a cathode coupled to the power supply terminal PWR.

Operations of the power supply control apparatus 5 will be described. In the normal operation, the voltage of the ground terminal GND (negative-polarity-side voltage VSS) is supplied to the back gate of the compensation transistor MN7 through the resistor R4 and the resistor R10. Thus, the compensation transistor MN7 and the protection transistor MN8 are in the non-conduction state. Similarly, since the negative-polarity-side voltage VSS is supplied to the base of each of the parasitic bipolar transistors Q6 to Q9, the parasitic bipolar transistors Q6 to Q9 maintain the non-conduction state also when the power supply 10 is in the high-voltage state. Since no current flows through the parasitic transistors in the standby state in the power supply control apparatus 5, the power supply control apparatus 5 is able to suppress an increase in consumption current. Further, the parasitic diodes D4a and D4b are reversely biased to be rendered non-conductive.

In the operation of the negative voltage surge mode, as is similar to the first exemplary embodiment, a resistance value of the resistor R4 is adjusted in advance. Hence, the voltage of the back gate of the compensation transistor MN7 is set to a voltage which is higher than the voltage of the output terminal OUT by about 0.5 V. Thus, the compensation transistor MN7 is rendered conductive. The voltage of the node C indicates a low voltage according to the voltage of the output terminal OUT. As a result, the protection transistor MN8 is deactivated as is similar to the first exemplary embodiment. Thus, a current path from the ground terminal GND to the output terminal OUT through the protection transistor MN8 (or parasitic diode D3f) and the discharge transistor MN1 is interrupted. Accordingly, the power supply control apparatus 5 protects the output transistor T1 from overvoltage with high accuracy without being influenced by the current from the reverse connection protection circuit 17 in the negative voltage surge mode.

In the reverse connection mode, a current path is formed from the ground terminal GND to the power supply terminal PWR through the resistor R10 and the diode D10. Further, a current path is formed from the ground terminal GND to the power supply terminal PWR through the resistor R10 and the parasitic diode D4a. In this case, the voltage at the anode of the diode D10 is a forward voltage (0.7 V, for example). Similarly, a current path is formed from the ground terminal GND to the power supply terminal PWR through the resistor R10, the resistor R4, and the parasitic diode D4b. In this case, however, the current that flows through the parasitic diode D4b is restricted by the resistor R4. Hence, the amount of current that flows through the parasitic diode D4b is smaller than the amount of current that flows through the parasitic diode D4a. Specifically, the forward voltage (0.5 V, for example) of the parasitic diode D4b is smaller than 0.7 V. Thus, a low potential is applied to the back gate voltage of each of the compensation transistor MN7 and the protection transistor MN8. Accordingly, the compensation transistor MN7 is rendered non-conductive, and the protection transistor MN8 is rendered conductive. Since the electric charges are supplied to the gate of the output transistor T1 through the protection transistor MN8, the output transistor T1 is rendered conductive. Further, since the forward voltage of the parasitic diode D4b is about 0.5 V, the parasitic bipolar transistors Q6 to Q9 are in the non-conduction state. Accordingly, no electric charge is drawn from the gate of the output transistor T1 by the parasitic bipolar transistors Q6 to Q9, and the output transistor T1 maintains the conduction state.

As described above, when the negative voltage is occurred in the turn-off period, the power supply control apparatus according to the exemplary embodiments brings the output transistor T1 into a conduction state, thereby protecting the output transistor T1 from overvoltage with high accuracy.

Further, the power supply control apparatus according to the exemplary embodiments of the present invention brings the output transistor T1 into a conduction state when the power supply 10 is reversely connected, thereby suppressing heat generation in the output transistor and preventing breakdown of the power supply control apparatus. Moreover, the power supply control apparatus according to the exemplary embodiments of the present invention can maintain the non-conduction state of the parasitic bipolar transistors and suppress an increase in consumption current even when the power supply control apparatus operates at the maximum allowable power supply voltage in the standby state when the power supply 10 is normally connected.

The present invention is not limited to the above exemplary embodiments, but can be modified in various manners without departing from the scope of the present invention. While the above exemplary embodiments show an example in which each element is formed on a single semiconductor substrate, the present invention is not limited thereto. In other words, the present invention is not limited to the configuration in which each element is formed on a single semiconductor substrate.

The first to fourth exemplary embodiments can be combined as desirable by one of ordinary skill in the art.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A power supply control apparatus comprising:
   an output transistor coupled between a first power supply line and an output terminal, the output terminal being configured to be coupled with a load;
   a protection transistor coupled between a gate of the output transistor and a second power supply line, and bringing the output transistor into a conduction state when a polarity of a power supply coupled between the first power supply line and the second power supply line is reversed;
   a negative voltage control unit coupled between the first power supply line and the gate of the output transistor, and bringing the output transistor into a conduction state when the counter electromotive voltage applied to the output terminal from the load exceeds a predetermined value;
   a compensation transistor bringing the second power supply line and the output terminal into a conduction state when a counter electromotive voltage from the load is applied to the output terminal; and
   a back gate control circuit that controls the second power supply line and a back gate of each of the compensation transistor and the protection transistor to be brought into a conduction state in a standby state when the polarity of the power supply is normal.

2. The power supply control apparatus according to claim 1, wherein when the polarity of the power supply is reversed, the back gate control circuit supplies a voltage according to a voltage of the first power supply line to the back gate of each of the compensation transistor and the protection transistor.

3. The power supply control apparatus according to claim 1, wherein the back gate control circuit comprises a first resistor that is provided between the second power supply line and a connection node of the back gate of each of the compensation transistor and the protection transistor.

4. The power supply control apparatus according to claim 3, wherein the first resistor is a diffusion resistor.

5. The power supply control apparatus according to claim 3, wherein the back gate control circuit comprises a first transistor having a first terminal and a back gate each coupled to the first resistor, a gate coupled to the first power supply line, and a second terminal coupled to the second power supply line.

6. The power supply control apparatus according to claim 5, wherein the back gate control circuit further comprises a second transistor that controls conduction/non-conduction between the output terminal and the back gate of each of the compensation transistor and the protection transistor according to a voltage of the second power supply line.

7. The power supply control apparatus according to claim 6, wherein the second transistor has a first terminal coupled to the output terminal, a second terminal and a back gate coupled to a connection node between the first resistor and the first transistor, and a gate coupled to the second power supply line.

8. The power supply control apparatus according to claim 7, wherein the gate of the second transistor is coupled to the second power supply line through a second resistor.

9. The power supply control apparatus according to claim 1, wherein the negative voltage control unit further comprises a dynamic clamping circuit that is coupled in series between the first power supply line and the gate of the output transistor, and limits a voltage difference between the first power supply line and the output terminal.

10. The power supply control apparatus according to claim 9, wherein the negative voltage control unit further comprises a switch circuit that is coupled in series with the dynamic clamping circuit, a conduction state of the switch circuit being controlled based on a result of comparing a reference voltage to a voltage of the output terminal.

11. The power supply control apparatus according to claim 1, further comprising:
a diode and a third resistor coupled in series between the first power supply line and the second power supply line, wherein the back gate control circuit is coupled to the second power supply line through the third resistor.

12. The power supply control apparatus according to claim 11, wherein the second terminal of the first transistor of the back gate control circuit is coupled to a connection node between the diode and the third resistor.

13. The power supply control apparatus according to claim 11, wherein the reference voltage applied to the negative voltage control unit is supplied from a connection node between the diode and the third resistor.

14. The power supply control apparatus according to claim 1, further comprising:
a discharge transistor coupled between the gate of the output transistor and the output terminal, and rendered conductive when the output transistor is brought into a non-conduction state.

15. The power supply control apparatus according to claim 14, further comprising:
a fourth resistor coupled between a back gate of the discharge transistor and the output terminal.

16. The power supply control apparatus according to claim 15, wherein the fourth resistor is a diffusion resistor.

* * * * *